US006597037B1

(12) United States Patent
Forbes et al.

(10) Patent No.: US 6,597,037 B1
(45) Date of Patent: *Jul. 22, 2003

(54) PROGRAMMABLE MEMORY ADDRESS DECODE ARRAY WITH VERTICAL TRANSISTORS

(75) Inventors: Leonard Forbes, Corvallis, OR (US); Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/669,281

(22) Filed: Sep. 26, 2000

Related U.S. Application Data

(60) Continuation of application No. 09/313,049, filed on May 17, 1999, now Pat. No. 6,153,468, which is a division of application No. 09/031,621, filed on Feb. 27, 1998, now Pat. No. 5,991,225.

(51) Int. Cl.$^7$ .......................... H01L 29/76; H01L 29/94
(52) U.S. Cl. ...................... 257/330; 257/302; 257/319; 257/321
(58) Field of Search ............................... 257/302, 319, 257/330, 331, 314, 315

(56) References Cited

U.S. PATENT DOCUMENTS

| 3,806,741 A | 4/1974 | Smith ......................... 307/304 |
| 4,051,354 A | 9/1977 | Choate ........................ 235/312 |
| 4,252,579 A * | 2/1981 | Ho et al. ..................... 257/316 |

(List continued on next page.)

FOREIGN PATENT DOCUMENTS

| JP | 11-135757 | 5/1999 | ......... H01L/27/108 |
| JP | 2000-164883 | 6/2000 | ......... H01L/29/786 |

OTHER PUBLICATIONS

Adler, E., et al., "The Evolution of IBM CMOS DRAM Technology", *IBM J. Res. Develop.*, 39(1/2), 167–188, (1995).

Asai, S., et al., "Technology Challenges for Integration Near and Below 0.1 micrometer", *Proceedings of the IEEE*, 85(4), Special Issue on Nanometer–Scale Science & Technology, 505–520, (Apr. 1997).

Askin, H.O., et al., "Fet Device Parameters Compensation Circuit", *IBM Technical Disclosure Bulletin*, 14, 2088–2089, (Dec. 1971).

(List continued on next page.)

*Primary Examiner*—Matthew Smith
*Assistant Examiner*—Lex H. Malsawma
(74) *Attorney, Agent, or Firm*—Schwegman, Lundberg, Woessner & Kluth, P.A.

(57) ABSTRACT

A programmable memory address decode array with vertical transistors having single or split control lines is used to select only functional lines in a memory array. The transistor is a field-effect transistor (FET) having an electrically isolated (floating) gate that controls electrical conduction between source regions and drain regions. If a particular floating gate is charged with stored electrons, then the transistor will not turn on and will act as the absence of a transistor at this location in a logic array within the decoder. The decoder is programmed at memory test to select an output line responsive to the bits received via the address input lines. A logic array includes densely packed logic cells, each logic cell having a semiconductor pillar providing shared source and drain regions for two vertical floating gate transistors that have individual floating gates and control lines distributed on opposing sides of the pillar. The control lines are formed together with interconnecting address input lines. The source regions share a common ground while the drain regions are connected to the output lines. Both bulk semiconductor and silicon-on-insulator embodiments are provided. If a floating gate transistor is used to represent a logic function, an area of only 2F$^2$ is needed per bit of logic, where F is the minimum lithographic feature size.

25 Claims, 17 Drawing Sheets

U.S. PATENT DOCUMENTS

| | | | |
|---|---|---|---|
| 4,604,162 A | 8/1986 | Sobczak | 156/657 |
| 4,630,088 A * | 12/1986 | Ogura et al. | 257/302 |
| 4,663,831 A | 5/1987 | Birrittella et al. | 29/576 E |
| 4,673,962 A | 6/1987 | Chatterjee et al. | 357/23.6 |
| 4,716,314 A | 12/1987 | Mulder et al. | 307/477 |
| 4,740,826 A | 4/1988 | Chatterjee | 357/42 |
| 4,761,385 A | 8/1988 | Pfiester | 437/52 |
| 4,761,768 A | 8/1988 | Turner et al. | 365/201 |
| 4,766,569 A | 8/1988 | Turner et al. | 365/185 |
| 4,845,537 A | 7/1989 | Nishimura et al. | 357/23.4 |
| 4,920,065 A | 4/1990 | Chin et al. | 437/52 |
| 4,929,988 A * | 5/1990 | Yoshikawa | 438/239 |
| 4,949,138 A | 8/1990 | Nishimura | 357/23.6 |
| 4,958,318 A | 9/1990 | Harari | 365/149 |
| 4,965,651 A | 10/1990 | Wagner | 357/42 |
| 4,987,089 A | 1/1991 | Roberts | 437/34 |
| 5,001,526 A * | 3/1991 | Gotou | 257/302 |
| 5,006,909 A | 4/1991 | Kosa | 357/23.6 |
| 5,010,386 A | 4/1991 | Groover, III | 357/42 |
| 5,017,504 A | 5/1991 | Nishimura et al. | 437/40 |
| 5,021,355 A | 6/1991 | Dhong et al. | 437/35 |
| 5,028,977 A | 7/1991 | Kenneth et al. | 357/43 |
| 5,057,896 A | 10/1991 | Gotou | 357/49 |
| 5,072,269 A | 12/1991 | Hieda | 357/23.6 |
| 5,083,047 A | 1/1992 | Horie et al. | 307/465 |
| 5,087,581 A | 2/1992 | Rodder | 437/41 |
| 5,102,817 A | 4/1992 | Chatterjee et al. | 437/47 |
| 5,110,752 A | 5/1992 | Lu | 437/47 |
| 5,128,831 A | 7/1992 | Fox, III et al. | 361/396 |
| 5,140,388 A | 8/1992 | Bartelink | 357/23.4 |
| 5,156,987 A | 10/1992 | Sandhu et al. | 437/40 |
| 5,177,028 A | 1/1993 | Manning | 437/41 |
| 5,177,576 A | 1/1993 | Kimura et al. | 257/71 |
| 5,202,278 A | 4/1993 | Mathews et al. | 437/47 |
| 5,208,657 A | 5/1993 | Chatterjee et al. | 257/302 |
| 5,216,266 A | 6/1993 | Ozaki | 257/302 |
| 5,221,867 A | 6/1993 | Mitra et al. | 307/465 |
| 5,223,081 A | 6/1993 | Doan | 156/628 |
| 5,266,514 A | 11/1993 | Tuan et al. | 437/52 |
| 5,292,676 A | 3/1994 | Manning | 437/46 |
| 5,316,962 A | 5/1994 | Matsuo et al. | 437/52 |
| 5,320,880 A | 6/1994 | Sandhu et al. | 427/578 |
| 5,327,380 A | 7/1994 | Kersh, III et al. | 365/195 |
| 5,363,325 A | 11/1994 | Sunouchi et al. | 365/149 |
| 5,365,477 A | 11/1994 | Cooper, Jr. et al. | 365/174 |
| 5,376,575 A | 12/1994 | Kim et al. | 437/52 |
| 5,379,255 A | 1/1995 | Shah | 365/185 |
| 5,382,540 A | 1/1995 | Sharma et al. | 437/52 |
| 5,385,854 A | 1/1995 | Batra et al. | 437/52 |
| 5,391,911 A | 2/1995 | Beyer et al. | 257/522 |
| 5,392,245 A | 2/1995 | Manning | 365/200 |
| 5,393,704 A | 2/1995 | Huang et al. | 437/203 |
| 5,396,093 A | 3/1995 | Lu | 257/306 |
| 5,396,452 A | 3/1995 | Wahlstrom | 365/149 |
| 5,409,563 A | 4/1995 | Cathey | 156/643 |
| 5,410,169 A | 4/1995 | Yamamoto et al. | 257/301 |
| 5,414,287 A | 5/1995 | Hong | 257/316 |
| 5,416,350 A | 5/1995 | Watanabe | 257/330 |
| 5,422,499 A | 6/1995 | Manning | 257/67 |
| 5,427,972 A | 6/1995 | Shimizu et al. | 437/52 |
| 5,432,739 A | 7/1995 | Pein | 365/185 |
| 5,438,009 A | 8/1995 | Yang et al. | 437/52 |
| 5,440,158 A | 8/1995 | Sung-Mu | 257/316 |
| 5,443,992 A | 8/1995 | Risch et al. | 437/29 |
| 5,445,986 A | 8/1995 | Hirota | 437/60 |
| 5,451,538 A | 9/1995 | Fitch et al. | 487/60 |
| 5,460,316 A | 10/1995 | Hefele | 228/39 |
| 5,460,988 A | 10/1995 | Hong | 437/43 |
| 5,466,625 A | 11/1995 | Hsieh et al. | 437/52 |
| 5,483,094 A | 1/1996 | Sharma et al. | 257/316 |
| 5,483,487 A | 1/1996 | Sung-Mu | 365/185.33 |
| 5,492,853 A | 2/1996 | Jeng et al. | 437/60 |
| 5,495,441 A | 2/1996 | Hong | 365/185.01 |
| 5,497,017 A | 3/1996 | Gonzales | 257/306 |
| 5,504,357 A | 4/1996 | Kim et al. | 257/306 |
| 5,508,219 A | 4/1996 | Bronner et al. | 437/52 |
| 5,508,542 A | 4/1996 | Geiss et al. | 257/301 |
| 5,519,236 A | 5/1996 | Ozaki | 257/302 |
| 5,528,062 A | 6/1996 | Hsieh et al. | 257/298 |
| 5,563,083 A | 10/1996 | Pein | 437/43 |
| 5,574,299 A | 11/1996 | Kim | 257/296 |
| 5,593,912 A | 1/1997 | Rajeevakumar | 437/52 |
| 5,612,559 A | 3/1997 | Park et al. | 257/302 |
| 5,616,934 A | 4/1997 | Dennison et al. | 257/67 |
| 5,637,898 A | 6/1997 | Baliga | 257/330 |
| 5,640,342 A | 6/1997 | Gonzalez | 365/156 |
| 5,641,545 A | 6/1997 | Sandhu | 427/573 |
| 5,644,540 A | 7/1997 | Manning | 365/200 |
| 5,646,900 A | 7/1997 | Tsukude et al. | 365/205 |
| 5,674,769 A | 10/1997 | Alsmeier et al. | 437/52 |
| 5,691,230 A | 11/1997 | Forbes | 437/62 |
| 5,705,415 A | 1/1998 | Orlowski et al. | 437/43 |
| 5,707,885 A | 1/1998 | Lim | 437/52 |
| 5,753,947 A | 5/1998 | Gonzalez | 257/296 |
| 5,818,084 A | 10/1998 | Williams et al. | 257/329 |
| 5,827,765 A | 10/1998 | Stengl et al. | 438/243 |
| 5,874,760 A * | 2/1999 | Burns, Jr. et al. | 257/315 |
| 5,907,170 A | 5/1999 | Forbes et al. | 257/296 |
| 5,909,618 A | 6/1999 | Forbes et al. | 438/242 |
| 5,914,511 A | 6/1999 | Noble et al. | 257/302 |
| 5,920,088 A | 7/1999 | Augusto | 257/192 |
| 5,936,274 A | 8/1999 | Forbes et al. | 257/315 |
| 5,943,267 A * | 8/1999 | Sekariapuram et al. | 365/185.28 |
| 5,963,469 A | 10/1999 | Forbes | 365/149 |
| 5,973,352 A | 10/1999 | Noble | 257/315 |
| 5,973,356 A | 10/1999 | Noble et al. | 257/319 |
| 5,981,995 A | 11/1999 | Selcuk | 257/330 |
| 5,991,225 A | 11/1999 | Forbes et al. | 365/230.06 |
| 5,998,820 A | 12/1999 | Chi et al. | 257/296 |
| 6,025,225 A | 2/2000 | Forbes et al. | 438/243 |
| 6,040,210 A | 3/2000 | Burns, Jr. et al. | 438/238 |
| 6,043,527 A | 3/2000 | Forbes | 257/296 |
| 6,066,869 A | 5/2000 | Noble et al. | 257/296 |
| 6,072,209 A | 6/2000 | Noble et al. | 257/296 |
| 6,150,687 A | 11/2000 | Noble et al. | 257/302 |
| 6,172,391 B1 | 1/2001 | Goebel | 257/305 |
| 6,221,788 B1 | 4/2001 | Kobayashi et al. | 438/762 |
| 6,255,708 B1 | 7/2001 | Sudharsanan et al. | 257/428 |

OTHER PUBLICATIONS

Banerjee, S.K., et al., "Characterization of Trench Transistors for 3–D Memories", *1986 Symposium on VLSI Technology, Digest of Technical Papers*, San Diego, CA, 79–80, (May 1986).

Blalock, T.N., et al., "A High–Speed Sensing Scheme for 1T Dynamic RAM's Utilizing the Clamped Bit–Line Sense Amplifier", *IEEE Journal of Solid–State Circuits, 27(4)*, pp. 618–624, (Apr. 1992).

Bomchil, G., et al., "Porous Silicon: The Material and its Applications in Silicon–On–Insulator Technologies", *Applied Surface Science, 41/42*, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

Burnett, D., et al., "Statistical Threshold–Voltage Variation and its Impact on Supply–Voltage Scaling", *Proceedings SPIE: Microelectronic Device and Multilevel Interconnection Technology, 2636*, 83–90, (1995).

Chen, M.J., et al., "Back–Gate Forward Bias Method for Low–Voltage CMOS Digital Circuits", *IEEE Transactions on Electron Devices, 43*, 904–909, (Jun. 1996).

Chen, M.J., et al., "Optimizing the Match in Weakly Inverted MOSFET's by Gated Lateral Bipolar Action", *IEEE Transactions on Electron Devices, 43*, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

Clemen, R., et al., "VT–compensated TTL–Compatible Mos Amplifier", *IBM Technical Disclosure Bulletin, 21*, 2874–2875, (1978).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

DeBar, D.E., "Dynamic Substrate Bias to Achieve Radiation Hardening", *IBM Technical Disclosure Bulletin, 25*, 5829–5830, (1983).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters, 17(11)*, 509–511, (Nov. 1996).

Fong, Y., et al., "Oxides Grown on Textured Single–Crystal Silicon—Dependence on Process and Application in EEPROMs", *IEEE Transactions on Electron Devices, 37(3)*, pp. 583–590, (Mar. 1990).

Forbes, L., "Automatic On–clip Threshold Voltage Compensation", *IBM Technical Disclosure Bulletin, 14*, 2894–2895, (1972).

Forbes, L., et al., "Resonant Forward–Biased Guard–Ring Diodes for Suppression of Substrate Noise in Mixed–Mode CMOS Circuits", *Electronics Letters, 31*, 720–721, (Apr. 1995).

Foster, R., et al., "High Rate Low–Temperature Selective Tungsten", In: *Tungsten and Other Refractory Metals for VLSI Applications III*, V.A. Wells, ed., Materials Res. Soc., Pittsburgh, PA, 69–72 (1988).

Frantz, H., et al., "Mosfet Substrate Bias–Voltage Generator", *IBM Technical Disclosure Bulletin, 11*, 1219–1220, (Mar. 1969).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, Austin, TX, 21–24, (1995).

Hao, M.Y., et al., "Electrical Characteristics of Oxynitrides Grown on Textured Single–Crystal Silicon", *Appl. Phys. Lett., 60*, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Optical Properties of Thin Solid Films*, Dover Pubs. Inc., New York, 155–206, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits, 2nd Edition*, Section: 9.1.3, 354–357, (1988).

Holman, W.T., et al., "A Compact Low Noise Operational Amplifier for a 1.2 Micrometer Digital CMOS Technology", *IEEE Journal of Solid–State Circuits, 30*, 710–714, (Jun. 1995).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Hu, G., et al., "Will Flash Memory Replace Hard Disk Drive?", *1994 IEEE International Electron Device Meeting*, Panel Discussion, Session 24, Outline, 2 pages, (Dec. 1994).

Huang, W.L., et al., "TFSOI Complementary BiCMOS Technology for Low Power Applications", *IEEE Transactions on Electron Devices, 42*, 506–512, (Mar. 1995).

Jun, Y.K., et al., "The Fabrication and Electrical Properties of Modulated Stacked Capacitor for Advanced DRAM Applications", *IEEE Electron Device Letters, 13*, 430–432, (Aug. 1992).

Jung, T.S., et al., "A 117–mm2 3.3–V Only 128–Mb Multilevel NAND Flash Memory for Mass Storage Applications", *IEEE Journa of Solid–State Circuits, 31*, 1575–1583, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics, 34*, 6899–6902, (Dec. 1995).

Klaus, et al., "Atomic Layer Controlled Growth of SiO2 Films Using Binary Reaction Sequence Chemistry", *Applied Physics Lett. 70(9)*, 1092–94, (Mar. 3, 1997).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics, 30*, L1221–L1223, (Jul. 1991).

Kuge, S., et al., "SOI–DRAM Circuit Technologies for Low Power High Speed Multigiga Scale Memories", *IEEE Journal of Solid–State Circuits, 31(4)*, pp. 586–591, (Apr. 1996).

Lantz, II, L., "Soft Errors Induced By Alpha Particles", *IEEE Transactions on Reliability, 45*, 174–179, (Jun. 1996).

Lehmann, et al., "A Novel Capacitor Technology Based on Porous Silicon", *Thin Solid Films 276, Elsevier Science*, 138–42, (1996).

Lehmann, V., "The Physics of Macropore Formation in Low Doped n–Type Silicon", *Journal of the Electrochemical Society, 140(10)*, 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices, 42*, 2117–2123, (Dec. 1995).

Malaviya, S., *IBM TBD, 15*, p. 42, (Jul. 1972).

Masu, K., et al., "Multilevel Metallization Based on Al CVD", *1996 IEEE Symposium on VLSI Technology, Digest of Technical Papers*, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology—Part B, 19*, 461–472, (Aug. 1996).

Muller, K., et al., "Trench Storage Node Technology for Gigabit DRAM Generations", *Digest IEEE International Electron Devices Meeting*, San Francisco, CA, 507–510, (Dec. 1996).

Nitayama, A., et al., "High Speed and Compact CMOS Circuits with Multipillar Surrounding Gate Transistors", *IEEE Transactions on Electron Devices, 36*, 2605–2606, (Nov. 1989).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes, 6*, 302–305, (Sep. 1995).

Oowaki, Y., et al., "New alpha–Particle Induced Soft Error Mechanism in a Three Dimensional Capacitor Cell", *IEICE Transactions on Electronics, 78–C*, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics, 76–C*, 1604–1610, (Nov. 1993).

Ott, A.W., et al., "Al3O3 Thin Film Growth on Si(100) Using Binary Reaction Sequence Chemistry", *Thin Solid Films*, vol. 292, 135–44, (1997).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters, 14*, 33–35, (Jan. 1993).

Pein, H., et al., "A 3–D Sidewall Flash EPROM Cell and Memory Array", *IEEE Transactions on Electron Devices, 40*, 2126–2127, (Nov. 1993).

Pein, H., et al., "Performance of the 3–D PENCIL Flash EPROM Cell and Memory Array", *IEEE Transactions on Electron Devices, 42*, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Puri, Y., "Substrate Voltage Bounce in NMOS Self–biased Substrates", *IEEE Journal of Solid–State Circuits, SC–13*, 515–519, (Aug. 1978).

Ramo, S., et al., *Fields and Waves in Communications Electronics, Third Edition*, John Wiley & Sons, Inc., pp. 428–433, (1994).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *IEEE International Electron Devices Meeting*, Washington, D.C., 714–717, (Dec. 1–4, 1985).

Sagara, K., et al., "A 0.72 micro–meter2 Recessed STC (RSTC) Technology for 256Mbit DRAMs using Quarter–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI, Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits, 26(4)*, pp. 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques, 42*, 1765–1773, (Sep. 1994).

Shah, A.H., et al., "A 4–Mbit DRAM with Trench–Transistor Cell", *IEEE Journal of Solid–State Circuits, SC–21*, 618–625, (Oct. 1986).

Shah, A.H., et al., "A 4Mb DRAM with Cross–Point Trench Transistor Cell", *1986 International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters, 16*, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits, 30*, 321–326, (Mar. 1995).

Stellwag, T.B., et al., "A Vertically–Integrated GaAs Bipolar DRAM Cell", *IEEE Transactions on Electron Devices, 38*, 2704–2705, (Dec. 1991).

Su, D.K., et al., "Experimental Results and Modeling Techniques for Substrate Noise in Mixed–Signal Integrated Circuits", *IEEE Journal of Solid–State Circuits, 28(4)*, 420–430, (Apr. 1993).

Suma, K., et al., "An SOI–DRAM with Wide Operating Voltage Range by CMOS/SIMOX Technology", *IEEE Journal of Solid–State Circuits, 29(11)*, pp. 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Suntola, T., "Atomic Layer Epitaxy", *Handbook of Crystal Growth 3, Thin Films of Epitaxy, Part B: Growth Mechanics and Dynamics, Elsevier, Amsterdam*, 601–63, (1994).

Sze, S.M., *VLSI Technology, 2nd Edition, Mc Graw–Hill, NY*, 90, (1988).

Takai, M., et al., "Direct Measurement and Improvement of Local Soft Error Susceptibility in Dynamic Random Access Memories", *Nuclear Instruments & Methods in Physics Research, B–99*, 562–565, (Nov. 7–10, 1994).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices, 38*, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices, 42*, 564–570, (Mar. 1995).

Verdonckt–Vandebroek, S., et al., "High–Gain Lateral Bipolar Action in a MOSFET Structure", *IEEE Transactions on Electron Devices 38*, 2487–2496, (Nov. 1991).

Vittal, A., et al., "Clock Skew Optimization for Ground Bounce Control", *1996 IEEE/ACM International Conference on Computer–Aided Design, Digest of Technical Papers*, San Jose, CA, 395–399, (Nov. 10–14, 1996).

Wang, N., *Digital MOS Integrated Circuits, Prentice Hall, Inc. , Englewood Cliffs, NJ*, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics, 35*, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys., 71*, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits, 30*, 960–971, (Sep. 1995).

Wooley, et al., "Experimental Results and Modeling Techniques for Substrate Noise in Mixed Signal Integrated Circuits", *IEEE Journal of Solid State Circuits*, vol. SC–28, 420–30, (1993).

Yamada, T., et al., "A New Cell Structure with a Spread Source/Drain (SSD) MOSFET and a Cylindrical Capacitor for 64–Mb DRAM's", *IEEE Transactions on Electron Devices, 38*, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

* cited by examiner

PROGRAMMABLE MEMORY ADDRESS DECODE ARRAY WITH VERTICAL TRANSISTORS

This application is a continuation of U.S. Ser. No. 09/313,049 filed May 17, 1999, now U.S. Pat. No. 6,153,468, which is a divisional of U.S. Ser. No. 09/031,621 filed Feb. 27, 1998, now U.S. Pat. No. 5,991,225.

TECHNICAL FIELD OF THE INVENTION

This invention relates generally to integrated circuits and in particular to a programmable memory address decode array with vertical transistors.

BACKGROUND OF THE INVENTION

Technological advances have permitted semiconductor integrated circuits to comprise significantly more circuit elements in a given silicon area. Reducing and eliminating defects in the circuit elements has, however, become increasingly more difficult with the increased number of circuit elements. To achieve higher population capacities, circuit designers strive to reduce the size of the individual circuit elements to maximize available die real estate. The reduced size makes these circuit elements increasingly susceptible to defects caused by material impurities during fabrication.

Nevertheless, defects are identifiable upon completion of the integrated circuit fabrication by testing procedures, either at the semiconductor chip level or after complete packaging. Scrapping or discarding defective integrated circuits when defects are identified is economically undesirable, particularly if only a small number of circuit elements are actually defective.

Relying on zero defects in the fabrication of integrated circuits is an unrealistic option. Therefore, redundant circuit elements are provided on integrated circuits to reduce the number of scrapped integrated circuits. If a primary circuit element is determined to be defective, a redundant circuit element is substituted for the defective primary circuit element. Substantial reductions in scrap are achieved by using redundant circuit elements without substantially increasing the cost of the integrated circuit.

One type of integrated circuit device using redundant circuit elements is integrated memory circuits, such as dynamic random access memories (DRAMs), static random access memories (SRAMs), video random access memories (VRAMs), and erasable programmable read only memories (EPROMs). Typical integrated memory circuits comprise millions of equivalent memory cells arranged in arrays of addressable rows and columns. The rows and columns of a memory cell array are the primary circuit elements of the integrated memory circuit. By providing redundant circuit elements, either as rows or columns, defective primary rows or columns can be replaced with functional ones.

Decoders perform an essential task by selecting the functional rows and columns of the integrated memory array. The memory cells within an integrated memory array are coupled to an electronic system through the address and data lines. Decoder circuits interface between the address lines and the array of memory cells.

A conventional decoder circuit of a semiconductor memory device comprises one or more separate decoder units which supply decode output signals according to an input address signal. A row decoder selects the appropriate row and the column decoder selects the appropriate column corresponding to a particular memory cell within the memory array. The pair of decoder output signals are also referred to as wordlines, which corresponds to a row decoder, and bitlines, which correspond to a column decoder.

Decoders contain the required logic functions required to properly address desired memory cells within a memory cell array. Traditionally, decoder circuits are masked with a logic configuration for selecting rows and columns. Once the logic function has been masked, it is very difficult to make a correction. An improperly programmed decoder results in an integrated memory device functioning incorrectly.

A technique used to correct a decoder after it has been masked is to use ion beams or lasers. Making corrections to a decoder after it has been programmed is a very time consuming and cumbersome process using these common techniques.

To provide some level of programmability in a decoder, antifuses are used. To program an antifuse "on," a large programming voltage is applied across the antifuse terminals, breaking down the interposed dielectric and forming a conductive link between the antifuse terminals. An unprogrammed "off" state, in which the antifuse is fabricated, presents a high resistance between the antifuse terminals. The antifuse can be reprogrammed to an "on" state in which a low resistance connection between the antifuse terminals is desired, but only for a very limited number of times.

Therefore, a problem with current row and column decoders is that once they are programmed with a particular logic function, changes are often difficult and complex to make. If a decoder is not properly programmed, the integrated memory circuit will likewise not function properly, which defeats the purpose of having redundant circuit elements on an integrated memory array. There are elaborate techniques to reprogram a decoder, but these techniques are cumbersome and time consuming. Therefore, there is a need in the art for a decoder that can be easily reprogrammed.

Another problem with decoders is that as integrated circuit technology advances, the size of individual circuit elements decreases. Designers can include more storage cells in a memory array on a semiconductor substrate. As the number of storage cells increases, the number of components in a decoder likewise need to increase.

Increasing the storage capacity of a decoder array requires a reduction in the size of the transistors and other components in order to increase the decoder's density. However, memory density is typically limited by a minimum lithographic feature size (F) imposed by lithographic processes used during fabrication. For example, the present generation of high density decoders require an area of $8F^2$ per bit of data. Therefore, there is a need in the art to provide even higher density decoders in order to further support the increased storage capacity of integrated memory circuits.

SUMMARY OF THE INVENTION

A programmable memory address decode array with vertical transistors is implemented for selecting only functional lines in a memory array. The decoder is programmed at memory test and is easily reprogrammed.

In one embodiment, a decoder for a semiconductor memory comprises a number of address input lines, a number of output lines, and an array of logic cells connected between the address input and the output to select an output line responsive to address bits received via the address input. Each logic cell includes at least a pair of transistors formed on opposing sides of a common pillar of semiconductor material that extends outwardly from a working surface of a substrate to form source, drain and body regions for the transistors. A number of floating gates are also formed wherein each gate is associated with a side of the pillar and a number of control lines are also formed wherein each control line is associated with a floating gate.

In particular, a decoder for a semiconductor memory comprises an array of logic cells. Each logic cell includes at least a pair of transistors formed on opposing sides of a common pillar of semiconductor material that forms source, drain and body regions for the transistors. At least a pair of floating gates are disposed adjacent to the opposing sides of the pillar. At least one first source and drain interconnection line, interconnecting one of the first source and drain regions of one of the logic cells is formed. A plurality of output lines, each output line interconnecting one of the second source and drain regions of one of the memory cells is also formed. A plurality of address input lines for receiving address bits are formed, wherein the array of logic cells connected between the plurality of address input lines and the plurality of output lines selects an output line responsive to the received address bits.

In another illustrative embodiment, a memory device comprises an array of memory cells, each memory cell includes a transistor, a capacitor, and a bit contact. Addressing circuitry is coupled to the array of memory cells via wordlines for accessing individual memory cells in the array of memory cells. The addressing circuitry includes a row decoder having a number of address input lines, a number of output lines, and an array of logic cells connected between the address input and the output to select a wordline responsive to address bits received via the address input. A read circuit is coupled to the array of memory cells via bitlines for reading individual memory cells in the array of memory cells. The read circuit includes a column decoder having a number of address input lines, a number of output lines, and an array of logic cells connected between the address input and the output to select a bitline responsive to address bits received via the address input.

In another embodiment, a computer system comprises a memory device. The memory device includes an array of memory cells, each memory cell includes a transistor, a capacitor, and a bit contact. Addressing circuitry is coupled to the array of memory cells via wordlines for accessing individual memory cells in the array of memory cells. The addressing circuitry includes a row decoder having an address input having N input lines, an output having $2^N$ output lines, and an array of logic cells connected between the address input lines and the output lines to select a wordline responsive to address bits received via the address input lines. A read circuit is coupled to the array of memory cells via bitlines for reading individual memory cells in the array of memory cells. The read circuit includes a column decoder having an address input having N input lines, an output having $2^N$ output lines, and an array of logic cells connected between the address input and the output to select a bitline responsive to address bits received via the address input.

In yet another embodiment, a method of forming a logic array for a decoder is provided. The method includes several steps as described below. A plurality of first conductivity type semiconductor pillars are formed upon a substrate, each pillar having top and side surfaces. Next, a plurality of first source and drain regions are formed, of a second conductivity type, each of the first source and drain regions formed proximally to an interface between the pillar and the substrate. Forming a plurality of second source and drain regions, of a second conductivity type, each of the second source and drain regions formed within one of the pillars and distal to the substrate and separate from the first and source drain region. Forming a gate dielectric on at least a portion of the side surface of the pillars. A plurality of floating gates is formed, each of the floating gates formed substantially adjacent to a portion of the side surface of one of the pillars and separated therefrom by the gate dielectric. A plurality of control lines are formed, each of the control lines formed substantially adjacent to one of the floating gates and insulated therefrom, such that there are two control lines between the common pillars. Forming an intergate dielectric, interposed between ones of the floating gates and one of the control lines. Forming an intergate dielectric, interposed between the two control lines between the common pillars. Forming a plurality of address input lines that interconnect the control lines. At least one first source/drain interconnection line interconnecting ones of the first source/drain regions is formed and a plurality of data lines are formed, each data line interconnecting ones of the second/source drain regions.

In a still further embodiment, a method of forming a decoder logic array on a substrate is provided. The method comprises the steps of forming a first source/drain layer at a surface of the substrate. Then a semiconductor epitaxial layer on the first source/drain layer is formed. Next, a second source/drain layer at a surface of the epitaxial layer is formed. Etching is performed, in a first direction, for a plurality of substantially parallel first troughs in the epitaxial layer. The steps continue with forming an insulator in the first troughs, etching, in a second direction that is substantially orthogonal to the first direction, a plurality of substantially parallel second troughs in the epitaxial layer, forming a gate dielectric layer substantially adjacent to sidewall regions of the second troughs, and forming a conductive layer in the second troughs. A portion of the conductive layer is removed in the second troughs such that floating gate regions are formed along the sidewall regions therein and separated from the sidewall regions by the gate dielectric layer. Finally, the steps include forming an intergate dielectric layer on exposed portions of the floating gate regions in the second troughs, and forming control line regions and address input lines between opposing floating gate regions in the second troughs and separated from the floating gate regions in the second troughs by the intergate dielectric layer.

In another embodiment, a method of forming a decoder logic array on a substrate is provided, comprising the steps of forming a first source/drain layer at a surface of the substrate, forming a semiconductor epitaxial layer on the first source/drain layer, forming a second source/drain layer at a surface of the epitaxial layer, etching, in a first direction, a plurality of substantially parallel first troughs in the epitaxial layer. The steps also include forming an insulator in the first troughs, etching, in a second direction that is substantially orthogonal to the first direction, a plurality of substantially parallel second troughs in the epitaxial layer, forming a gate dielectric layer substantially adjacent to sidewall regions of the second troughs, forming a conductive layer in the second troughs and removing a portion of the conductive layer in the second troughs such that floating gate regions are formed along the sidewall regions therein and separated from the sidewall regions by the gate dielectric layer. Finally, the following steps are performed. Forming an intergate dielectric layer on exposed portions of the floating gate regions in the second troughs, forming split control line regions and address input lines between opposing floating gate regions in the second troughs, separating from the floating gate regions in the second troughs by the intergate dielectric layer, and separating the split control lines by the intergate dielectric layer.

Therefore, bulk semiconductor and semiconductor-on-insulator embodiments of the present invention provide a high density programmable memory address decode device. If a floating gate of transistor data is used to represent a logic function, an area of only $2F^2$ is needed, where F is the minimum lithographic feature size. The programmability of the decoder device is particularly advantageous for selecting functional lines in a memory array without having to program a logic array with a mask. If a logic change needs to be made to the decoder, selected transistors in the logic array are simply reprogrammed.

A programmable memory decode device thus allows a user to define a selected output line in response to address bits received via an address input. The logic function is defined without having to actually mask a logic array. In different embodiments of the invention, bulk semiconductor, semiconductor-on-insulator, single control lines, split control lines and floating gates of varying scope are described. Still other and further embodiments, aspects and advantages of the invention will become apparent by reference to the drawings and by reading the following detailed description.

DETAILED DESCRIPTION OF THE INVENTION

Figure 1:
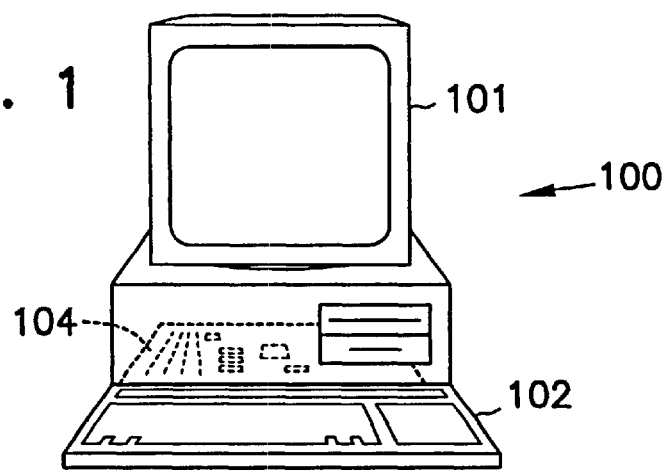
FIG. 1 illustrates a personal computer of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
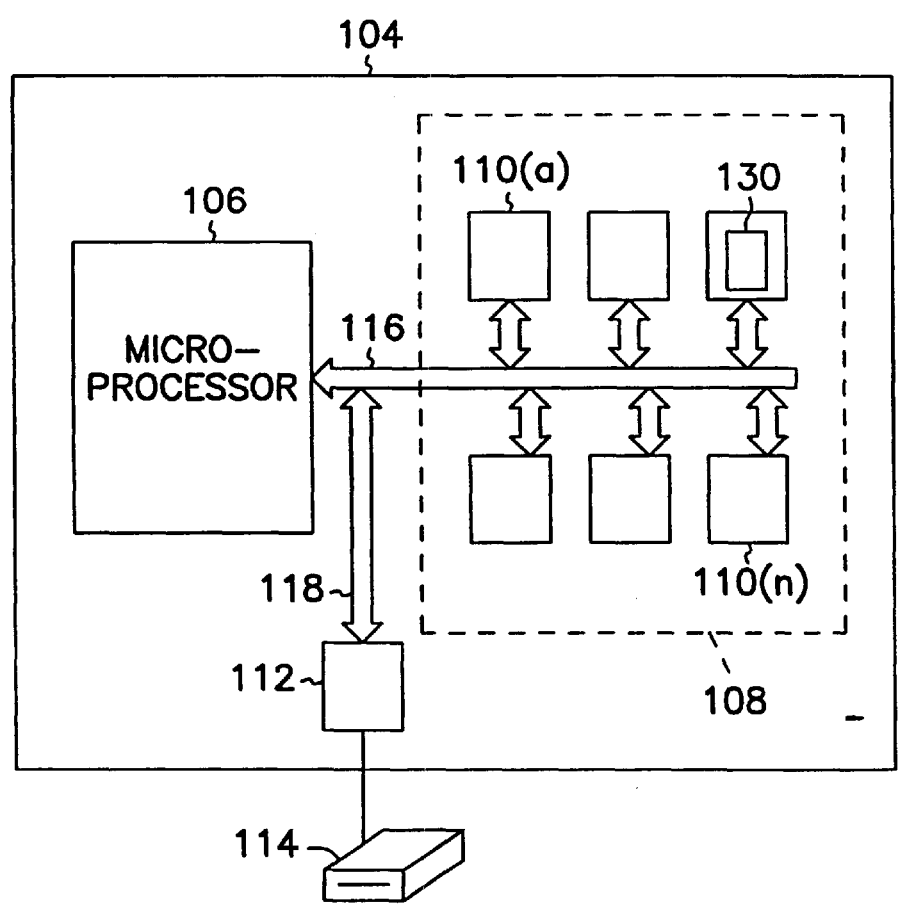
FIG. 2 illustrates a block diagram of an interface for a microprocessor and a memory device of FIG. 1.

A personal computer 100 is illustrated in FIGS. 1 and 2, and includes a monitor 101, a keyboard input 102, and a central processing unit 104. The processing unit 104 typically includes a microprocessor 106, a memory bus circuit 108 having a plurality of memory slots 110($a$–$n$), and other peripheral circuitry 112. Peripheral circuitry 112 permits various peripheral devices 114 to interface the processor-memory bus 116 over the input/output (I/O) bus 118.

The microprocessor 106 produces control and address signals to control the exchange of data between the memory bus circuit 108 and the microprocessor 106, and between the memory bus circuit 108 and the peripheral circuitry 112. This exchange of data is accomplished over the high speed memory bus 116 and over the high speed I/O bus 118.

A plurality of memory slots 110($a$–$n$) are coupled to the memory bus 116 for receiving memory devices 130 well known to those skilled in the art. Memory devices include, but are not limited to the following types: static random access memory (SRAM), dynamic random access memory (DRAM), synchronous dynamic random access memory (SDRAM), erasable programmable read-only memory (EPROM), electrically erasable programmable read-only memory (EEPROM), or Flash memories. A memory device 130 is illustrated in FIG. 2 in one of the memory slots 110(a–n). A memory device 130 may be packaged as a single in-line memory module (SIMM) or a dual in-line memory module (DIMM), or any other packaging schemes well known in the art.

Furthermore, these memory devices 130 can be produced in a variety of designs which provide different methods of reading from and writing to a memory cell of a memory device 130. For example, a preferred method of reading and writing to a dynamic random access memory (DRAM) device is a page mode operation. Page mode operations in a DRAM access a row of a memory cell arrays and randomly access different columns of the array. Data stored at the row and column intersection can be read and output while that column is accessed.

Another type of memory device 130 is an extended data output (EDO) memory which allows data stored at a memory array address to be available as output after the addressed column has been closed. EDO memory can increase some communication speeds by allowing shorter access signals without reducing the time in which memory output data is available on the memory bus 116.

Those skilled in the art will recognize that a wide variety of memory devices 130 may be used in the implementation of the present invention. The DRAM implementation described herein is illustrative only and not intended to be exclusive or limiting. A DRAM device compatible with the memory slots 110(a–n) is illustrated generally at 200 in block diagram form in FIG. 3. The description of the DRAM 200 has been simplified for purposes of illustrating a DRAM memory device and is not intended to be a complete description of all the features of a DRAM. Those skilled in the art will recognize that a wide variety of memory devices 130 may be used in the implementation of the present invention.

Figure 3:
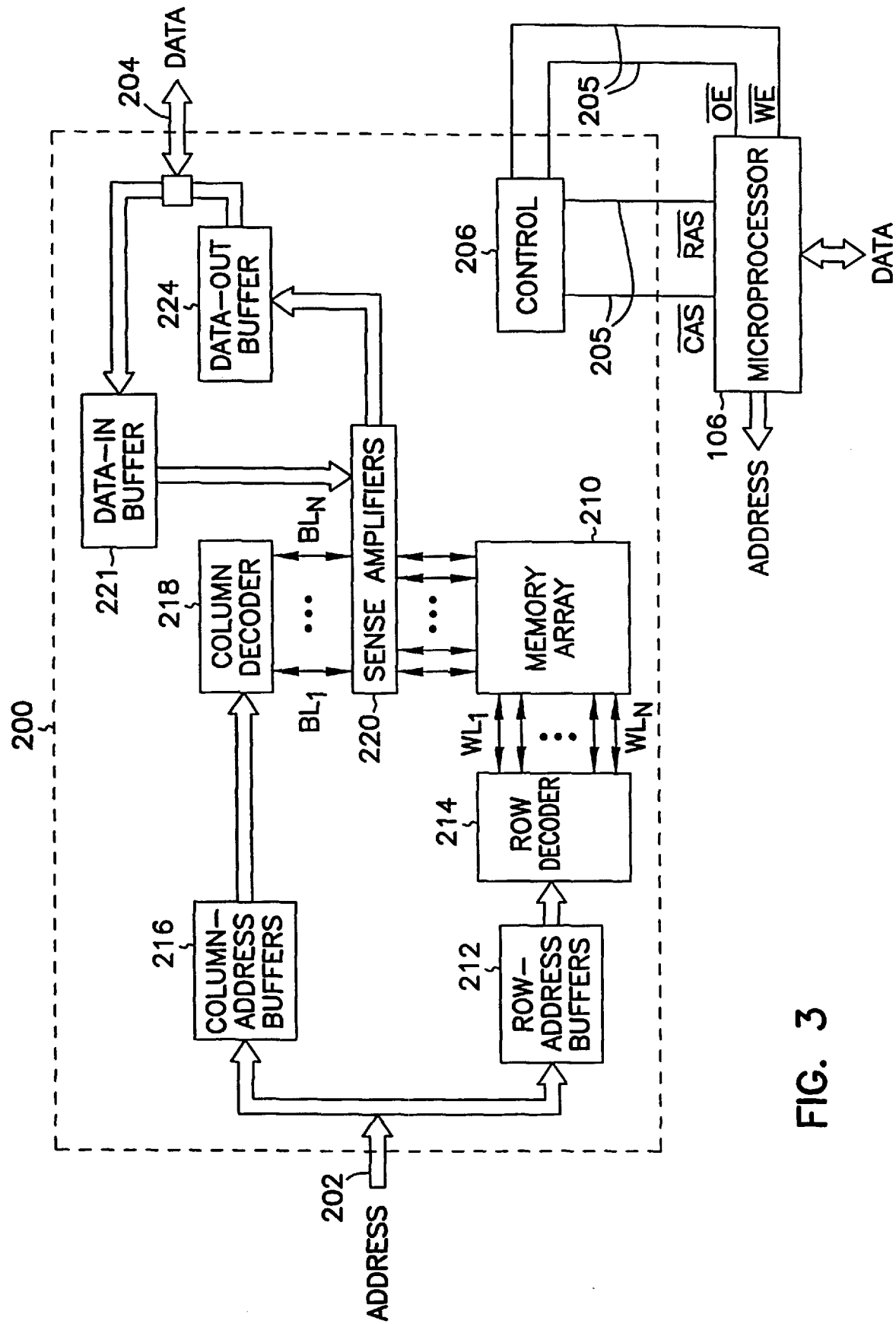
FIG. 3 is a block diagram illustrating generally an architecture of a DRAM integrated memory circuit.

In referring to the DRAM 200 device illustrated in FIG. 3, address information is provided on input line 202, data information is provided on input line 204, and control input is provided on a variety of input lines 205 directed to a control logic 206. Control lines 205 are discussed in more detail within the following paragraphs. Input lines 202, 204, and 205 correspond to individual inputs from the memory bus 116 illustrated in FIG. 2.

As is well known in the art, the DRAM 200 includes a memory array 210 which in turn comprises rows and columns of addressable memory cells. Each memory cell in a row is coupled to a common wordline, as illustrated by lines $WL_1-WL_m$. Additionally, each memory cell in a column is coupled to a common bitline, as illustrated by lines $BL_1-BL_n$. Each cell in the memory array 210 includes a storage capacitor and an access transistor as is conventional in the art.

The DRAM 200 interfaces with, for example, the microprocessor 106 through address lines 202 and data lines 204. Alternatively, DRAM 200 may interface with a DRAM controller, a micro-controller, a chip set or other electronic system. The microprocessor 106 also provides a number of control signals to the DRAM 200 via the control lines 205, including but not limited to, row and column address strobe signals RAS* and CAS*, write enable signal WE*, an output enable signal OE* and other conventional control signals.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, an asterisk (*) following the signal name in this application indicates that the signal is negative or inverse logic. Negative or inverse logic is considered active when the signal is low.

A row address buffer 212 and a programmable decode array 214 receive and decode row addresses from row address signals provided on address lines 202 by the microprocessor 106. Each unique row address corresponds to a row of cells in the memory array 210. The programmable decode array 214 includes a wordline driver, an address decoder tree, and circuitry which translates a given row address received from the row address buffers 212 and selectively activates the appropriate wordline of the memory array 210 via the wordline drivers.

A column address buffer 216 and a column decoder 218 receive and decode column address signals provided on the address lines 202 by the microprocessor 106. Each unique column address corresponds to a column of cells in the memory array 210. The column decoder 218 also determines when a column is defective. The column decoder 218 is coupled to sense amplifiers 220. The sense amplifiers 220 are coupled to complementary pairs of bitlines of the memory array 210.

The sense amplifiers 220 are coupled to a data-in buffer 221 and a data-out buffer 224. The data-in buffers 221 and the data-out buffers 224 are coupled to the data lines 204. During a write operation, the data lines 204 provide data to the data-in buffer 221. The sense amplifier 220 receives data from the data-in buffer 221 and stores the data in the memory array 210 as a charge on a capacitor of a cell at an address specified on the address lines 202.

During a read operation, the DRAM 200 transfers data to microprocessor 106 from the memory array 210. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of the sense amplifiers 220 detects and amplifies a difference in voltage between the complementary bitlines. The sense amplifier passes the amplified voltage to the data-out buffer 224.

The control logic 206 is used to control the many available functions of the DRAM 200. In addition, various control circuits and signals not detailed herein initiate and synchronize the DRAM 200 operation as known to those skilled in the art. As stated above, the description of DRAM 200 has been simplified for purposes of illustrating the present invention and is not intended to be a complete description of all the features of a DRAM.

Bitlines $BL_1-BL_n$ are used to write to and read data from the memory cells within the memory array 210. The wordlines $WL_1-WL_m$ are used to access a particular row of the memory cells that is to be written or read. The programmable row decode array 214 and the column decoder 218 selectably access the memory cells in response to address signals that are provided on the address lines 202 from the microprocessor 106 during write and read operations.

In operation, the DRAM memory 200 receives an address of a particular memory cell at the address buffers 212 and 216. For example, the microprocessor 106 may provide the address buffers 212 and 216 with the address for a particular cell within the memory array 210. The row address buffer 212 identifies wordline $WL_1$, for example, for the appropriate memory cell to the row decoder 214. The row decoder 214 selectively activates the wordline $WL_1$ to activate an access transistor of each memory cell connected to the wordline $WL_1$. The column address buffer 216 identifies bitline $BL_1$, for example, for the appropriate memory cell to the column decoder 218. The column decoder 218 selectively activates the bitline $B_1$ to activate an access transistor of each memory cell connected to the bitline $BL_1$.

Figure 4:
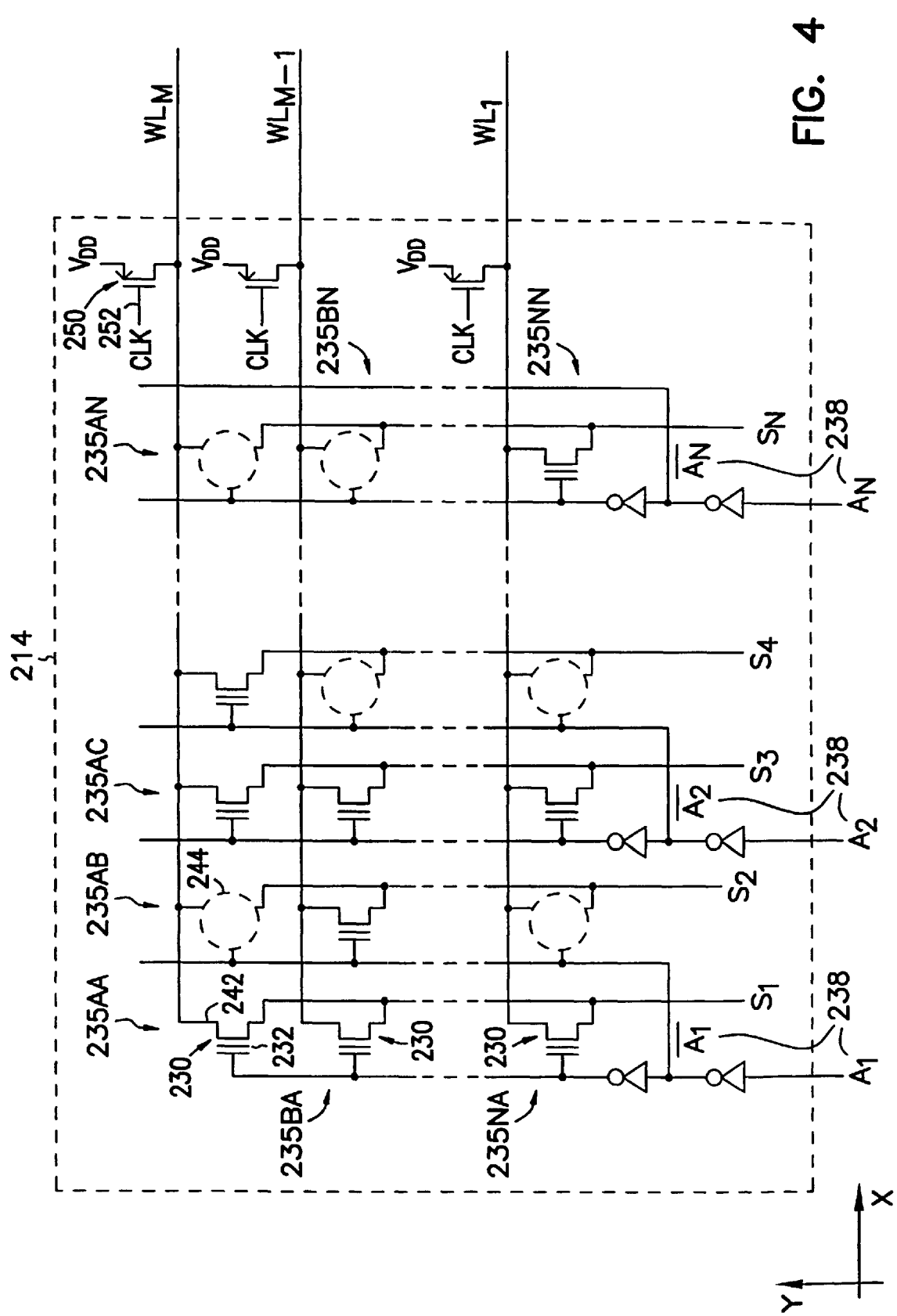
FIG. 4 is a schematic diagram illustrating generally an architecture of one embodiment of a programmable decode array.

FIG. 4 is a schematic diagram illustrating generally an architecture of one embodiment of the programmable row decoder 214. The architecture of the programmable column decoder 218 is substantially the same and is not discussed in detail. Array type memory address decode circuits which are not programmable are well known in the art. The programmable NOR row decoder 214 of FIG. 4 is implemented with plurality of transistors 230 each having a corresponding floating gate 232.

The transistors 230 are arranged in logic cells, such as cells 235AA, 235BA, . . . , 235NA, in a first dimension, e.g., in the Y-dimension of the decoder output lines $WL_1$–$WL_m$, and in cells such as 235AA, 235AB, . . . , 235AN in a second dimension, e.g., in the X-dimension of the memory address interconnection lines $A_1$–$A_n$. Each logic cell 235 thus includes one of the plurality of transistors 230 having a corresponding floating gate 232. Each logic cell 235 further includes a control line 238. The control lines 238 receive address signals provided via the address line 202. Received address signals are directed to selected floating gates 232 of a transistor 230 via the control lines 238. The control lines 238 are further identified more specifically as memory address input lines $A_1$–$A_n$. Therefore, address input lines $A_1$–$A_n$ are interchangeable with the general reference term control lines 238.

The transistor 230 is a floating gate transistor, which is a field-effect transistor (FET) having an electrically isolated (floating) gate 232 that controls electrical conduction between source regions S1–SN and drain regions 242. Drain regions 242 are interconnected with wordlines $WL_1$–$WL_m$. Source regions S1–SN share a common ground for operation of the row decoder 214. As an alternative embodiment to a common ground, sources S1–SN do not share a common ground.

The programmable decode array 214 is programmed at memory test to select only functional wordlines within the memory array 210. The NOR row decoder 214 serves as an illustrative embodiment of programmable memory address decoders using the transistors 230 described herein. Other decoding schemes are acceptable, such as AND, OR, and NAND, etc.

The programmable decode array 214 has address lines $A_1$–$A_n$ as inputs and wordlines $WL_1$–$WL_m$ as output lines. For N address input lines, there are a maximum of $2^N$ outputs lines. However, the number of outputs in the programmable decode array 214 could be less than $2^N$. Depending on the combination of high and low signals received via the corresponding $A_1$–$A_n$ input lines, any one of the $2^N$ possible outputs corresponding to the wordlines $WL_1$–$WL_m$ may be selected.

Programmability of the transistor 230 is achieved by charging the corresponding floating gate 232. When the floating gate 232 is charged, the transistor 230 remains in an off state until the transistor 230 is reprogrammed. Applying and removing a charge to the floating gate 232 is discussed in more detail within the following description. A transistor 230 in an off state is represented by a dotted circle 244 instead of actually displaying the full transistor. A transistor programmed in an off state remains in that state until the charge is removed from the floating gate 232.

Transistors 230 not having their floating gate 232 precharged are fully illustrated in FIG. 4. These transistors 230 operate in either an on state or an off state, wherein address signals received on their respective address input lines $A_1$–$A_n$ determine the applicable state. Each transistor 230 has a source, drain region fabricated using a semiconductor pillar on a substrate. Source S1–SN is connected to a common ground for all the transistors 230 and the drain 242 is tied to a wordline row, e.g., $WL_1$.

If any transistor 230 is turned on, then a ground is provided to a pull up transistor 250. The pull up transistor 250 is attached to a wordline row, e.g., $WL_m$. The transistor 250 provides a low voltage level when any one of the transistors 230 connected to the corresponding wordline row is activated. When the transistor 230 is in an off state, an open is provided to the source of the pull up transistor 250, wherein the $V_{DD}$ voltage level is applied to the memory array 210 when the pull up transistor 250 is turned on by a clock signal received via input line 252.

Figure 5A:
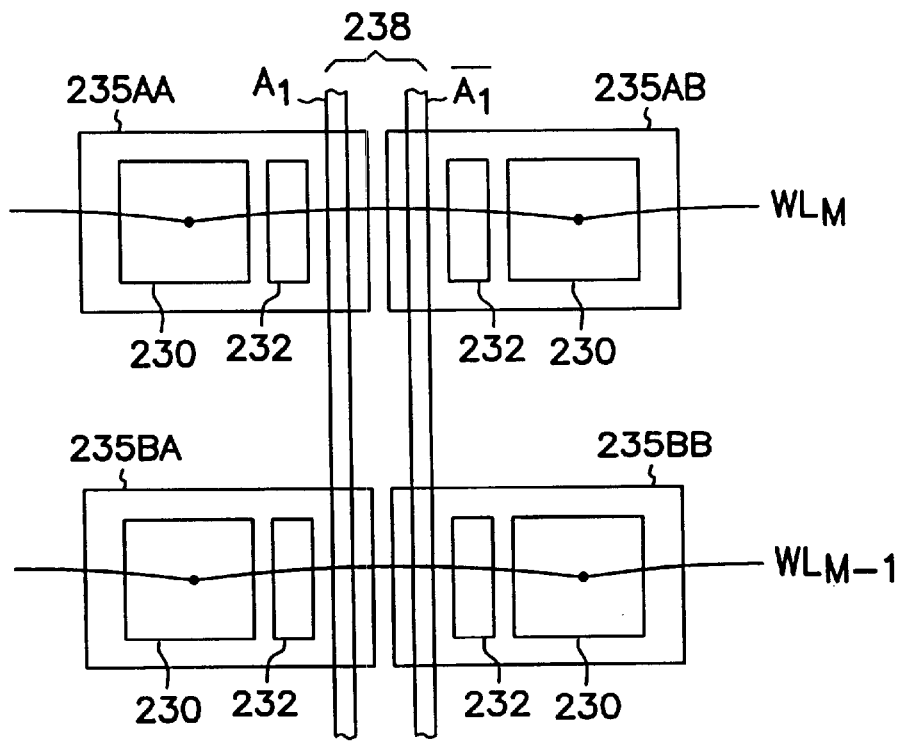
FIGS. 5A illustrates a top view of a portion of an array of logic cells having a split control line.
Figure 5B:
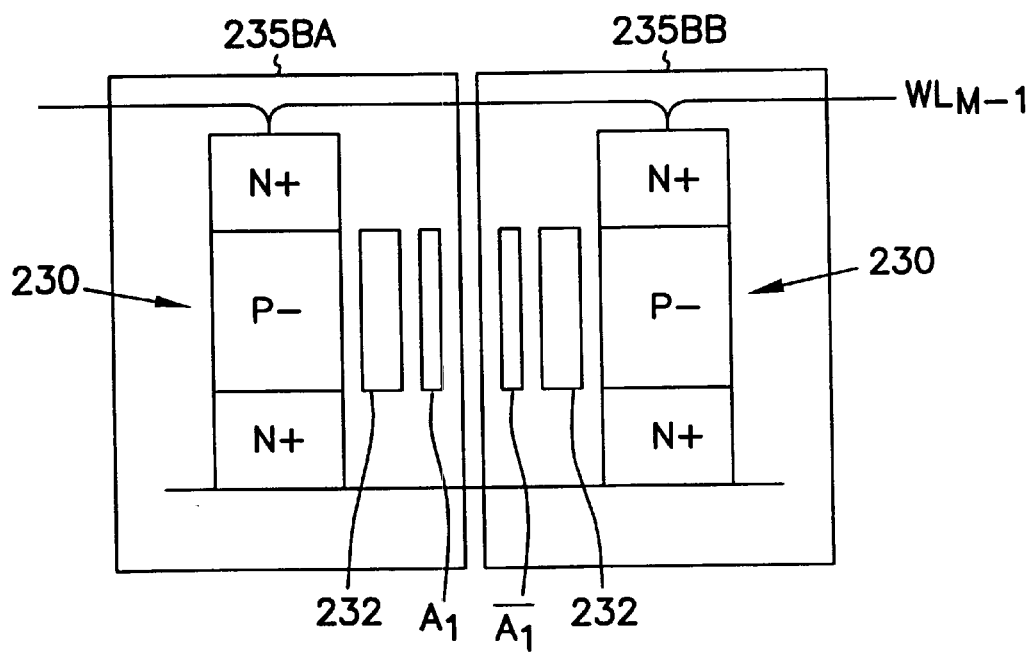
FIG. 5B illustrates a front view of a portion of an array of logic cells having a split control line.

FIGS. 5A and 5B illustrate a top view and a front view, respectively, of the logic cells 235AA, 235BA, 235AB and 235BB having a split control line 238, e.g., $\overline{A}_1$ and $A_1$. The advantage of split control lines 238 is that this requires only one transistor 230 per logic cell 235. Since the split control lines 238 are isolated from each other, this allows a single transistor 230 to be selected.

Figure 5C:
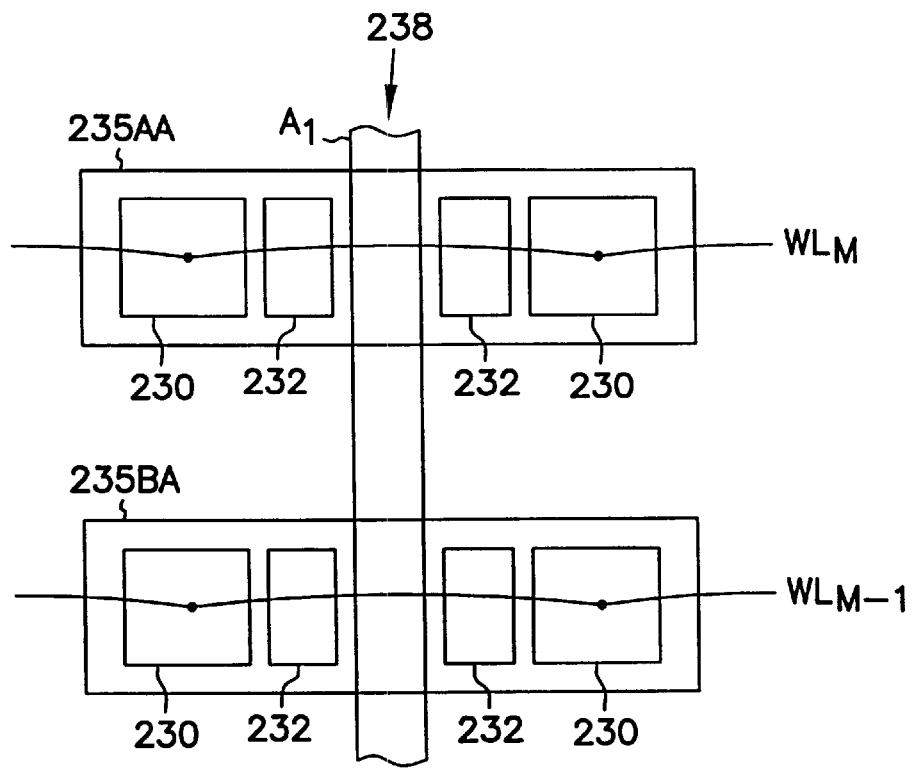
FIG. 5C illustrates a top view of an alternative embodiment of the array of logic cells of FIG. 5A having a single control line.
Figure 5D:
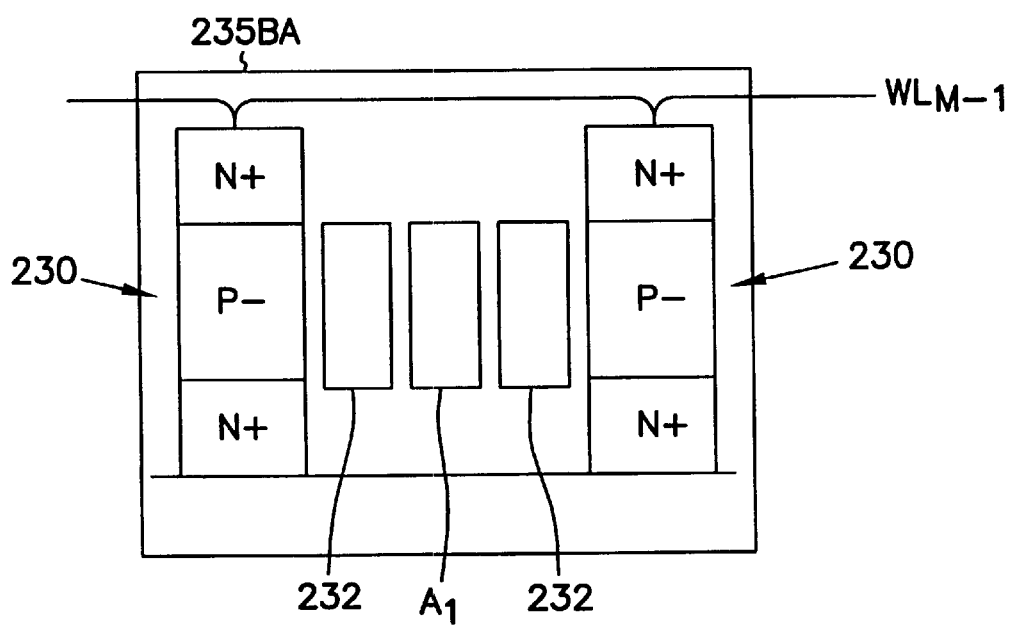
FIG. 5D illustrates a front view of an alternative embodiment of the array of logic cells of FIG. 5A having a single control line.

FIGS. 5C and 5D illustrate a top view and a front view, respectively, of an alternative embodiment of logic cells 235AA and 235BA of FIG. 5A having a single control line, e.g., $A_1$. When a single control line $A_1$ is high, the two transistors 230 on each side of the control line 238 are activated at the same time. The advantage is that there is redundancy in the selection of a wordline, but the drawback is the loss of circuit density because of this duplication.

Figure 6A:
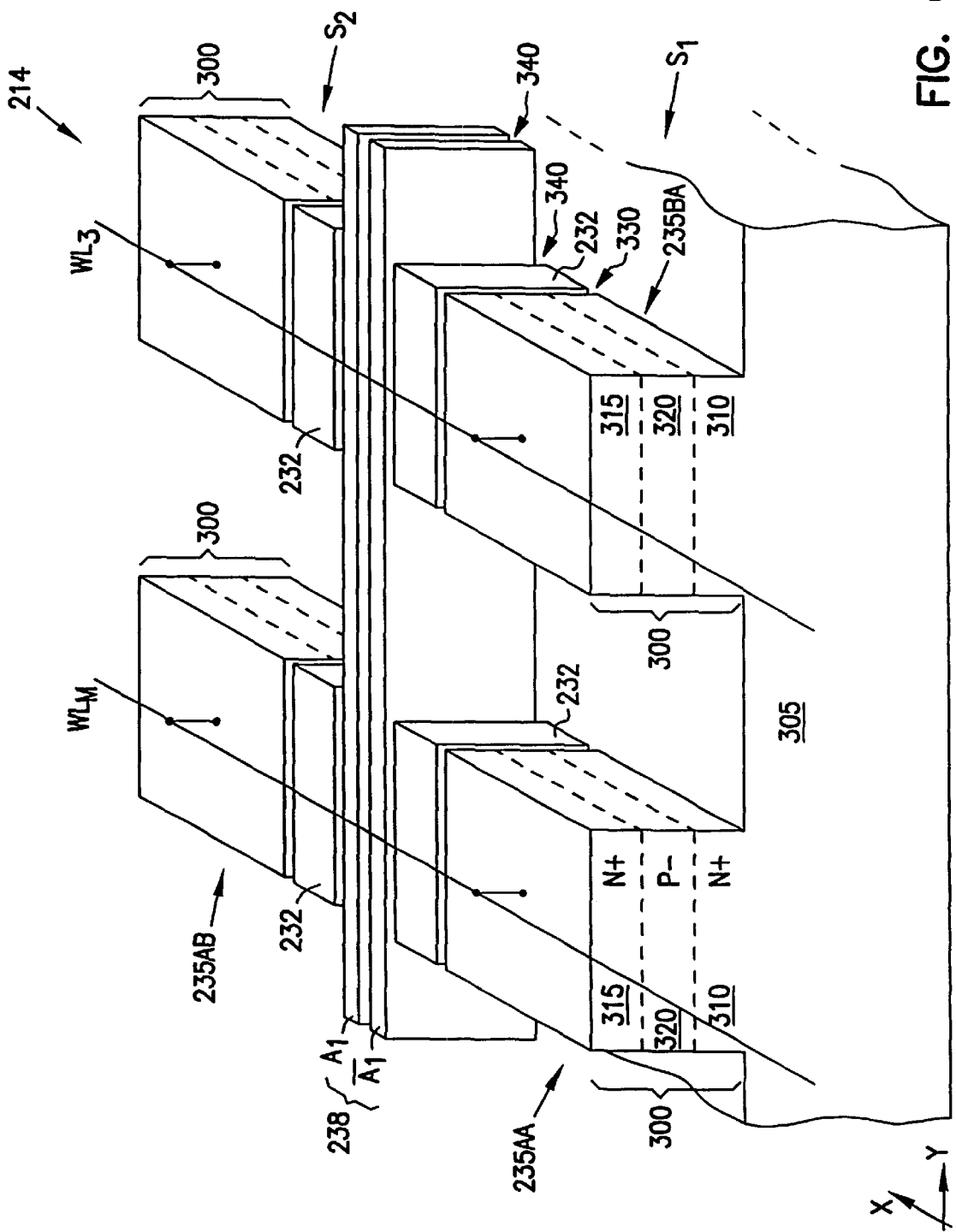
FIG. 6A is a perspective view illustrating generally one embodiment of a completed programmable decode array, including portions of four transistors having split control lines.

FIG. 6A is a perspective view illustrating generally one embodiment of a completed programmable decode array 214, including portions of four transistors 230 having split control lines 238, such as illustrated in FIGS. 5A and 5B. In FIG. 6A, the substantially identical transistors are illustrated by way of example through logic cells 235AA, 235BA, 235AB and 235BB. Each logic cell 235 includes a semiconductor pillar 300, initially of a first conductivity type such as P− silicon, fabricated upon a monolithic substrate 305. In one embodiment, substrate 305 is a bulk semiconductor, such as P− silicon. In another embodiment, a semiconductor-on-insulator (SOI) substrate 305 includes an insulating layer, such as silicon dioxide ($SiO_2$), as described below.

Each pillar 300 includes a first source/drain region of a second conductivity type, such as N+ silicon source region 310, formed proximally to a sub-micron dimensional interface between pillar 300 and substrate 305. Each pillar 300 also includes a second source/drain region of the second conductivity type, such as N+ silicon drain region 315, that is distal to substrate 305, and separated from source region 310 by a first conductivity type region, such as P− body region 320.

Each pillar 300 provides a source region 310, a drain region 315, and a body region 320 for floating gate transistor 230 of a particular logic cell, e.g., 235AA. In one embodiment, the physical dimensions of each pillar 300 and the doping of P− body region 320 are both sufficiently small to allow operation of the floating gate transistors 230 that is characteristic of fully depleted body transistors. First source, drain region interconnection lines S1–SN electrically interconnects the source region 310 of each pillar 300 of cells.

In one embodiment, the first source/drain interconnection lines S1–SN comprise a conductively doped semiconductor of the second conductivity type, such as N+ silicon, disposed at least partially within substrate 305. For example, dopants can be ion-implanted or diffused into substrate 305 to form the first source/drain interconnection lines S1–SN.

In another embodiment, the first source, drain interconnection lines S1–SN are formed above substrate 305. For example, a doped epitaxial semiconductor layer can be grown on substrate 305, from which first source, drain interconnection lines S1–SN are formed. Alternatively, an undoped epitaxial semiconductor layer can be grown on substrate 305, and dopants then introduced by ion-implantation or diffusion to obtain the first source, drain interconnection lines S1–SN of the desired conductivity.

Each pillar 300 is outwardly formed from substrate 305, and is illustrated in FIG. 6A as extending vertically upward from substrate 305. Each pillar 300 has a top region that is separated from substrate 305 by four surrounding side regions. A floating gate 232 is formed substantially adjacent to two opposing side surfaces of pillar 300, and separated therefrom by a gate dielectric 330, such that there are two floating gates 232 per pillar 300, though FIG. 6A omits some of the floating gates 232 for clarity of illustration.

Each floating gate 232 has a corresponding substantially adjacent control line 238 from which it is separated by an intergate dielectric 340. Except at the periphery of the array 214, there are two control lines 238 interposed between two approximately adjacent pillars 300. For example, in FIG. 6A, address input lines $A_1$ and $\overline{A}_1$ are interposed between logic zones 235AA, 235BA on one side and logic zones 235AB and 235BB on the other side. Address input line $A_1$ controls logic zones 235AA and 235BA while address input line $\overline{A}_1$ controls logic zones 235AB and 235BB. Address input lines $A_1$ and $\overline{A}_1$ are separated by an intergate dielectric 340.

In the single control line embodiment, a single control line 238 controls the two transistors 230 on each side of the control line, e.g., address input line $A_1$. A logic cell 235 has two transistors operated from a single control line 238, as shown in FIG. 5D. This is in contrast to the split control line 238 embodiment where only one transistor 230 is operated by a control line 238.

Control lines 238 are interposed between approximately adjacent pillars 300, wherein the memory address input lines $A_1$–$A_n$ are substantially parallel to each other. In this embodiment, address input lines $A_1$–$A_n$ are illustrated as running in the Y-dimension, e.g. perpendicular to wordlines $WL_1$–$WL_m$. Each of the memory address input lines $A_1$–$A_n$ interconnects a plurality of transistors 230. For example, address input line $A_1$ electrically interconnects floating gate 232 of logic cells 235AA–235NA. Having split control lines 238 allows the floating gates 232 to be independent between pairs of logic cells, 235AA and 235BA, 235AB and 235BB, 235AN and 235BN. In the embodiment of FIG. 6A, the address input lines $A_1$–$A_n$ are disposed above substrate 305, as described below.

Drain regions 315 of the pillars 300 are interconnected by wordlines $WL_1$–$WL_m$ that are substantially parallel to each other in the X-dimension, e.g. perpendicular to address input lines $A_1$–$A_n$. FIG. 6A illustrates, by way of example, wordlines $WL_m$ and $WL_{m-1}$, which are shown schematically for clarity. However, it is understood that wordlines $WL_1$–$WL_m$ comprise metal or other interconnection lines that are isolated from the underlying topology, e.g. pillars 300, floating gates 232, address input lines $A_1$–$A_n$ (control lines 238), and wordlines $WL_1$–$WL_m$, by an insulating layer through which contact holes are etched to access the drain regions 315 of the pillars 300.

Figure 6B:
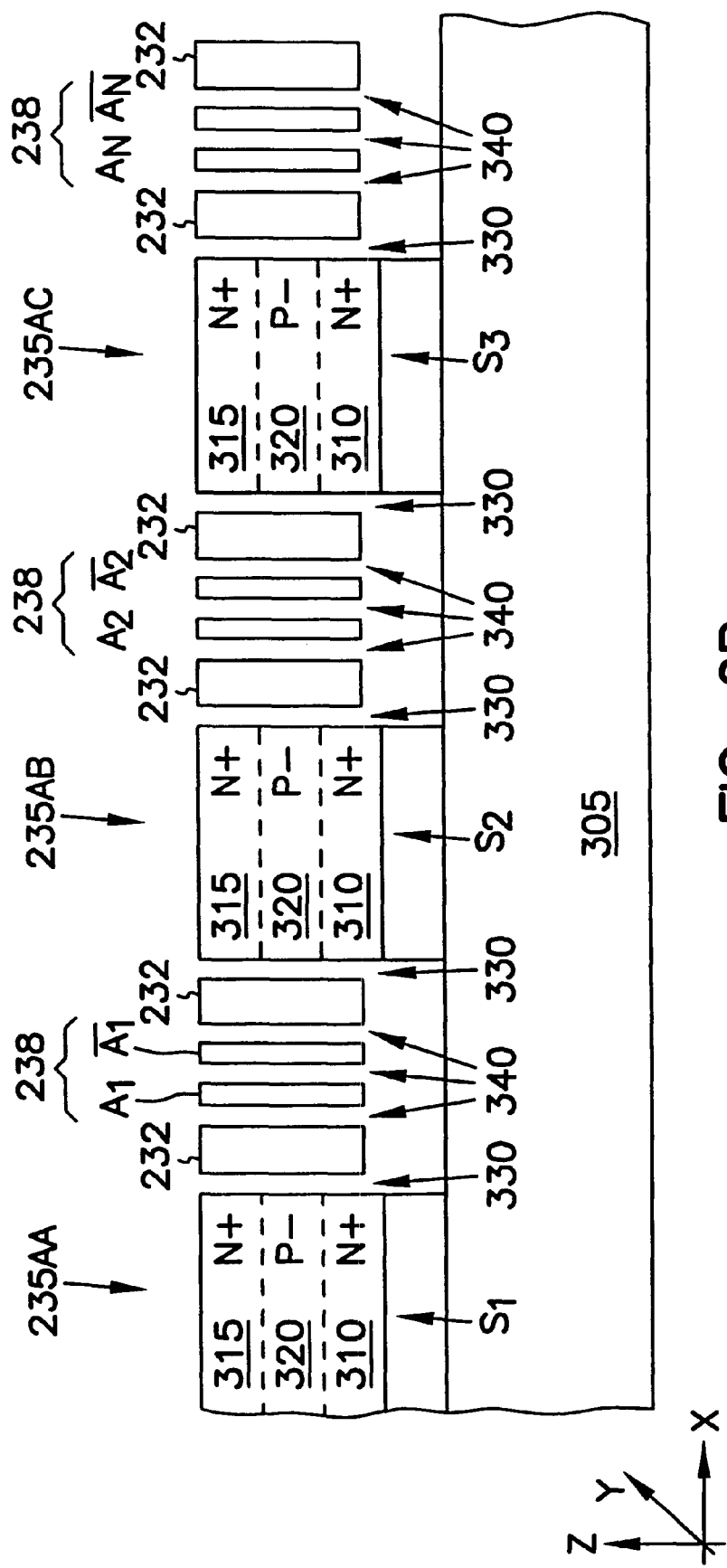
FIG. 6B is a cross-sectional view of the completed programmable row decoder of FIG. 6A looking perpendicular to wordlines $WL_1$–$WL_m$.

FIG. 6B is a cross-sectional view of FIG. 6A looking in the Y-dimension, e.g. perpendicular to wordlines $WL_1$–$WL_m$. FIG. 6B illustrates a row of logic cells 235AA, 235AB, . . . , 235AN, having source regions 310 interconnected by one of first source/drain interconnection lines S1, S2, . . . , SN.

Figure 7:
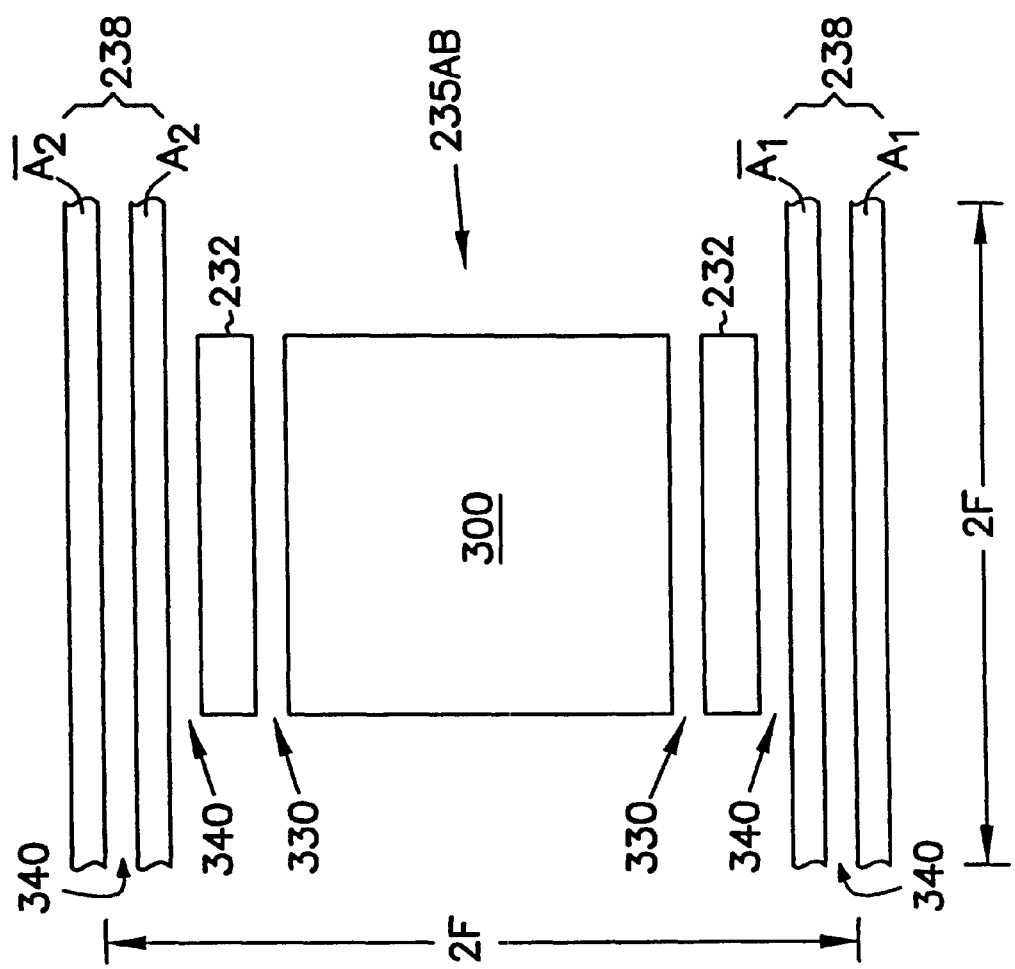
FIG. 7 is a plan view looking toward the working surface of a substrate, illustrating generally by way of example one embodiment of a logic cell.

FIG. 7 is a plan view, looking toward the working surface of substrate 305, illustrating generally by way of example one embodiment of logic cell 235AB. Each of the two floating gates 232 is adjacent to one of opposing sides of pillar 300, and separated therefrom by gate dielectric 330. Each control line 238 is separated from a corresponding floating gate 232 by an intergate dielectric 340. The control lines 238 are likewise separated by intergate dielectric 340. Each control line 238 is integrally formed together with one of the address input lines $A_1$–$A_n$.

The center-to-center spacing ("pitch") between control lines 238 that are on opposite sides of pillar 300 is twice the minimum lithographic feature size F. Since two floating gate transistors 230 are contained within a logic cell 235 having an area of $4F^2$, an area of only $2F^2$ is needed per logic cell.

In one embodiment, programming of one of the floating gate transistors 230 is by hot electron injection. For example, a voltage of approximately 10 volts is provided to a particular one of address input lines $A_1$, $A_2$, . . . , $A_n$ adjacent to a particular floating gate 232. A resulting inversion region (channel) is formed in the body region 320 at the surface that is approximately adjacent to the particular one of address input lines $A_1$–$A_n$. A voltage of approximately 10 Volts is provided through a particular one of wordlines $WL_1$–$WL_m$ to a particular drain region 315. A voltage of approximately 0 Volts is provided, through a particular one of first source/drain interconnection lines S1–SN, to the particular source region 310 of the floating gate transistor 230.

Electrons are injected onto the floating gate 232 interposed between the control line 238 and the pillar 300 in which the particular drain region 315 is disposed. The exact value of the voltages provided to the particular control line 238 and drain region 315 will depend on the physical dimension of the floating gate transistor 230, including the thickness of the gate dielectric 330, the thickness of the intergate dielectric 340, and the separation between source region 310 and drain region 315. Alternatively, if higher voltages are provided to control line 238, and the gate dielectric 330 and intergate dielectric 340 are made thinner, the floating gate transistor 230 may be programmed instead by Fowler-Nordheim tunneling of electrons from the body region 320, source region 310, or drain region 315.

In one embodiment, reading data stored on a particular floating gate transistor 230 includes providing a voltage of approximately 5 volts to a particular one of the address input lines $A_1$, $A_2$, . . . , $A_n$ to the particular floating gate 232 of the corresponding floating gate transistor 230. A voltage of approximately 0 Volts is provided common ground S1, S2, . . . , SN to the particular source region 310 of the particular floating gate transistor 230. A particular one of wordlines $WL_1$–$WL_m$ that is switchably coupled to the drain region 315 of the floating gate transistor 230 is precharged to a positive voltage by transistor 250, then coupled to the drain region 315 to determine the conductivity state of the floating gate transistor 230 between its source region 310 and drain region 315.

If there are no electrons stored on the floating gate 232, the floating gate transistor 230 will conduct between its source region 310 and drain region 315, decreasing the voltage of the particular one of wordlines $WL_1$–$WL_m$ toward that voltage of its source region 310, e.g. toward a "low" binary logic level voltage of approximately 0 Volts. If there are electrons stored on the floating gate 210, the floating gate transistor 230 will not conduct between its source region 310 and drain region 315. As a result, pull up transistor 250 will tend to increase the voltage of the particular one of wordlines $WL_1$–$WL_m$ toward a positive voltage, e.g. toward a "high" binary logic voltage level.

In one embodiment, erasure of floating gate transistors 230 includes providing an erasure voltage difference of approximately between 10 and 12 Volts from a source region 310 to a corresponding floating gate 232. For example, a voltage of approximately 0 Volts is provided to source regions 310 of floating gate transistors 230 that are interconnected by one or several first source/drain interconnection lines S1, S2, . . . , SN. A voltage of approximately between 10 and 12 Volts is provided through a corresponding one or several of the address input lines $A_1$–$A_n$ to the floating gates 232 of the corresponding floating gate transistors 230 to be erased. As a result of the negative voltage applied to the floating gates 232, electrons are removed from the corresponding floating gates 232 by Fowler-Nordheim tunneling, thereby removing the charge from one of the floating gate transistors 230.

In another example, a voltage of approximately between –5 and –6 Volts is applied to the floating gate 232 and a voltage of approximately between +5 and +6 Volts is applied to the source regions 310 in order to obtain the erasure voltage difference of approximately between 10 and 12 Volts from a source region 310 to a corresponding floating gate 232. The exact value of the erasure voltage difference will vary depending upon the physical dimensions of the floating gate transistor 230 and the thicknesses of gate dielectric 330 and intergate dielectric 340.

In one embodiment, the entire programmable decode array 214 of floating gate transistors 230 is simultaneously erased by applying approximately between –10 and –12 Volts to each of address input lines $A_1$–$A_n$, and also applying 0 Volts to each of first source/drain interconnection lines S1, S2, . . . , SN. In another embodiment, one or more sectors of the programmable decode array 214 are simultaneously erased by selectively applying approximately between –10 and –12 Volts to one or more of control lines $A_1$–$A_n$ and also applying 0 Volts to one or more of first source/drain interconnection lines S1, S2, . . . , SN.

FIGS. 8–16 illustrate generally one embodiment of a method of forming the programmable decode array 214. In this embodiment, the programmable decode array 214 is formed using bulk silicon processing techniques and is described, by way of example, with respect to a particular technology having a minimum lithographic feature size F, which is also sometimes referred to as a critical dimension (CD), of 0.4 microns. However, the process steps described below can be scaled accordingly for other minimum feature sizes without departing from the scope of the invention.

The term "horizontal" as used in this application is defined as a plane parallel to the conventional plane or surface of a wafer or substrate, regardless of the orientation of the wafer or the substrate. The term "vertical" refers to a direction perpendicular to the horizontal as defined above. Prepositions, such as "on," "side," (as in sidewall), "higher," "lower," "over," and under are defined with respect to the conventional plane or surface being on the top surface of the wafer or substrate, regardless of the orientation of the wafer or substrate.

Figure 8:
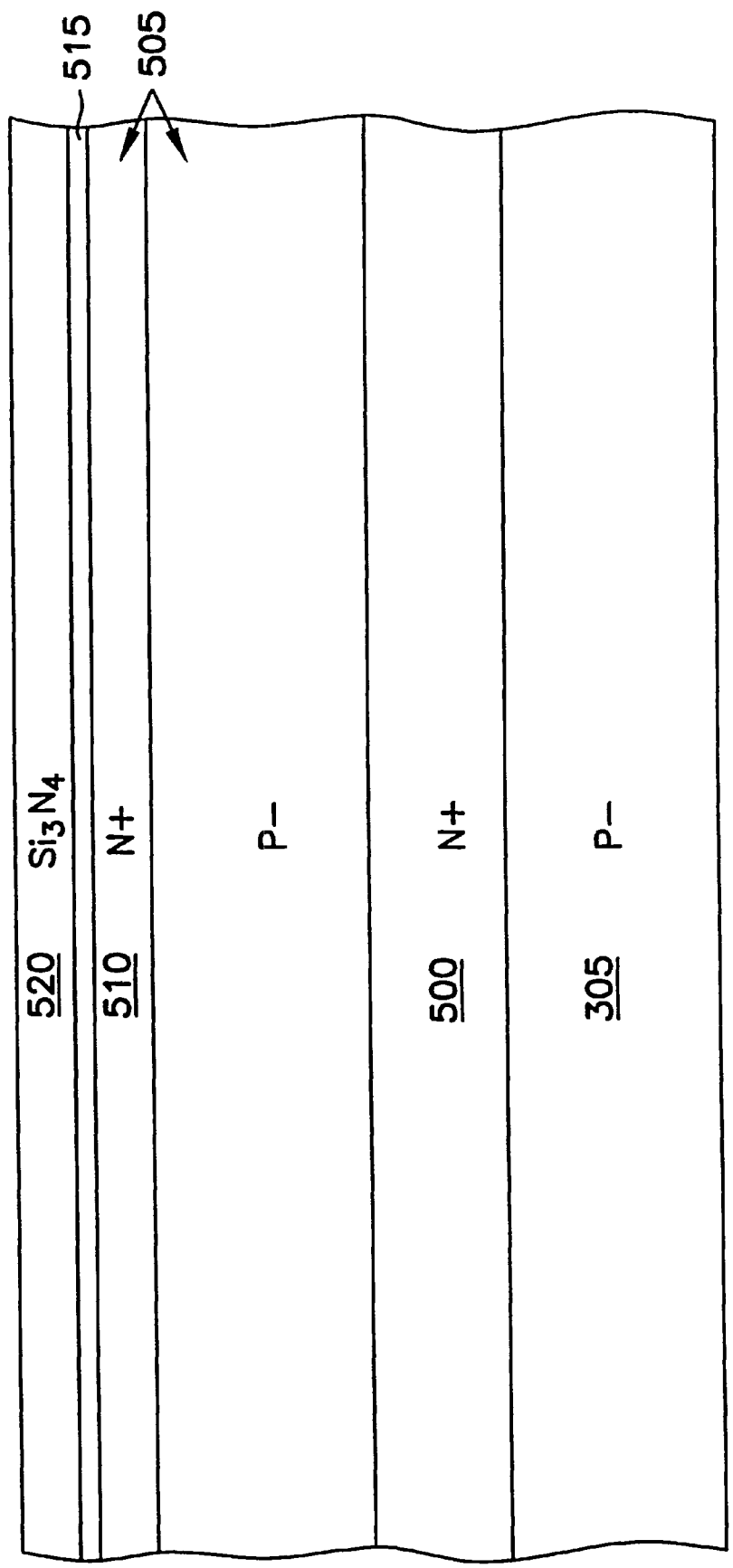
FIG. 8 illustrates a side view of a substrate material having a plurality of source/drain layers on top of the substrate material for forming a programmable row decoder.

In FIG. 8, a P– silicon starting material is used for substrate 305. A first source/drain layer 500, of approximate thickness between 0.2 microns and 0.5 microns, is formed at a working surface of substrate 305. In one embodiment, first source/drain layer 500 is N+ silicon formed by ion-implantation of donor dopants into substrate 305. In another embodiment, first source/drain layer 500 is N+ silicon formed by epitaxial growth of silicon upon substrate 305. On the first source/drain layer 500, a semiconductor epitaxial layer 505, such as P– silicon of 0.6 micron approximate thickness, is formed, such as by epitaxial growth.

A second source/drain layer 510, such as N+ silicon of 150 nanometers approximate thickness, is formed at a surface of the epitaxial layer 505, such as by ion-implantation of donor dopants into P– epitaxial layer 505 or by epitaxial growth of N+ silicon on P– epitaxial layer 505. A thin layer of silicon dioxide ($SiO_2$), referred to as pad oxide 515, is deposited on the second source/drain layer 510. Pad oxide 515 has a thickness of approximately 10 nanometers. A layer of silicon nitride ($Si_3N_4$), referred to as pad nitride 520, is deposited on the pad oxide 515. Pad nitride 520 has a thickness of approximately 100 nanometers.

Figure 9:
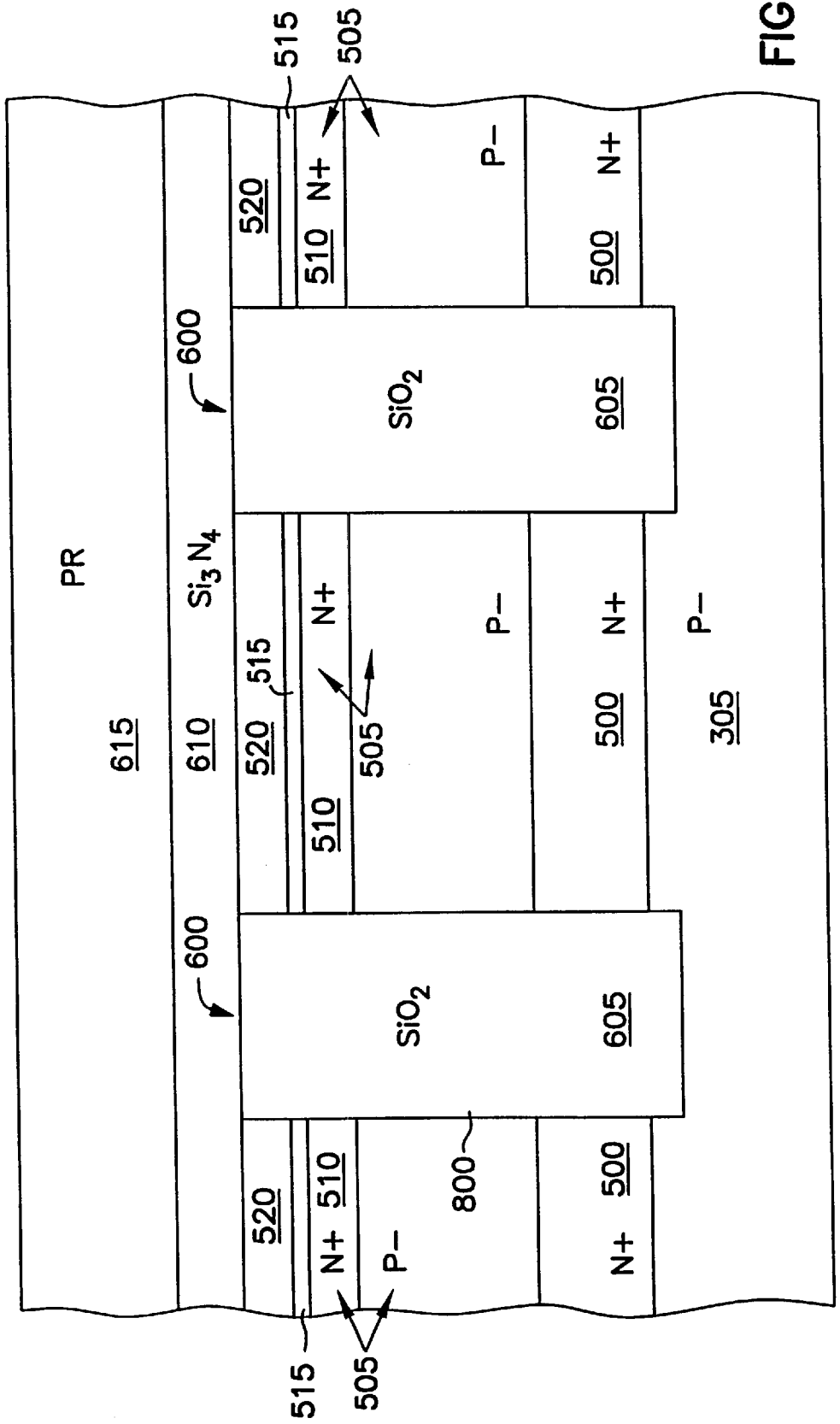
FIG. 9 illustrates a plurality of parallel first troughs extending through a plurality of layers formed on top of a substrate material.

In the bulk silicon embodiment of FIG. 9, photoresist masking and selective etching techniques are used to form, in the first dimension (e.g., the Y-dimension, which is perpendicular to the plane of the drawing of FIG. 9), a plurality of substantially parallel first troughs 600 that extend through the pad nitride 520, pad oxide 515, second source/drain layer 510, the underlying portion of epitaxial layer 505, first source/drain layer 500, and at least partially into underlying P– silicon substrate 305.

The photoresist is then removed by conventional photoresist stripping techniques, and an insulator 605, such as silicon dioxide deposited by chemical vapor deposition (CVD), is formed to fill first troughs 600. The insulator 605 is planarized (e.g. exposing underlying portions of pad nitride 520) such as by chemical mechanical polishing (CMP) or other suitable planarization technique. A masking layer 610 such as, for example, silicon nitride deposited by CVD and having an approximate thickness of 200 nanometers, is then formed on insulator 605 and elsewhere on the working surface of substrate 305. A photoresist layer 615 is then formed on masking layer 610.

Figure 10:
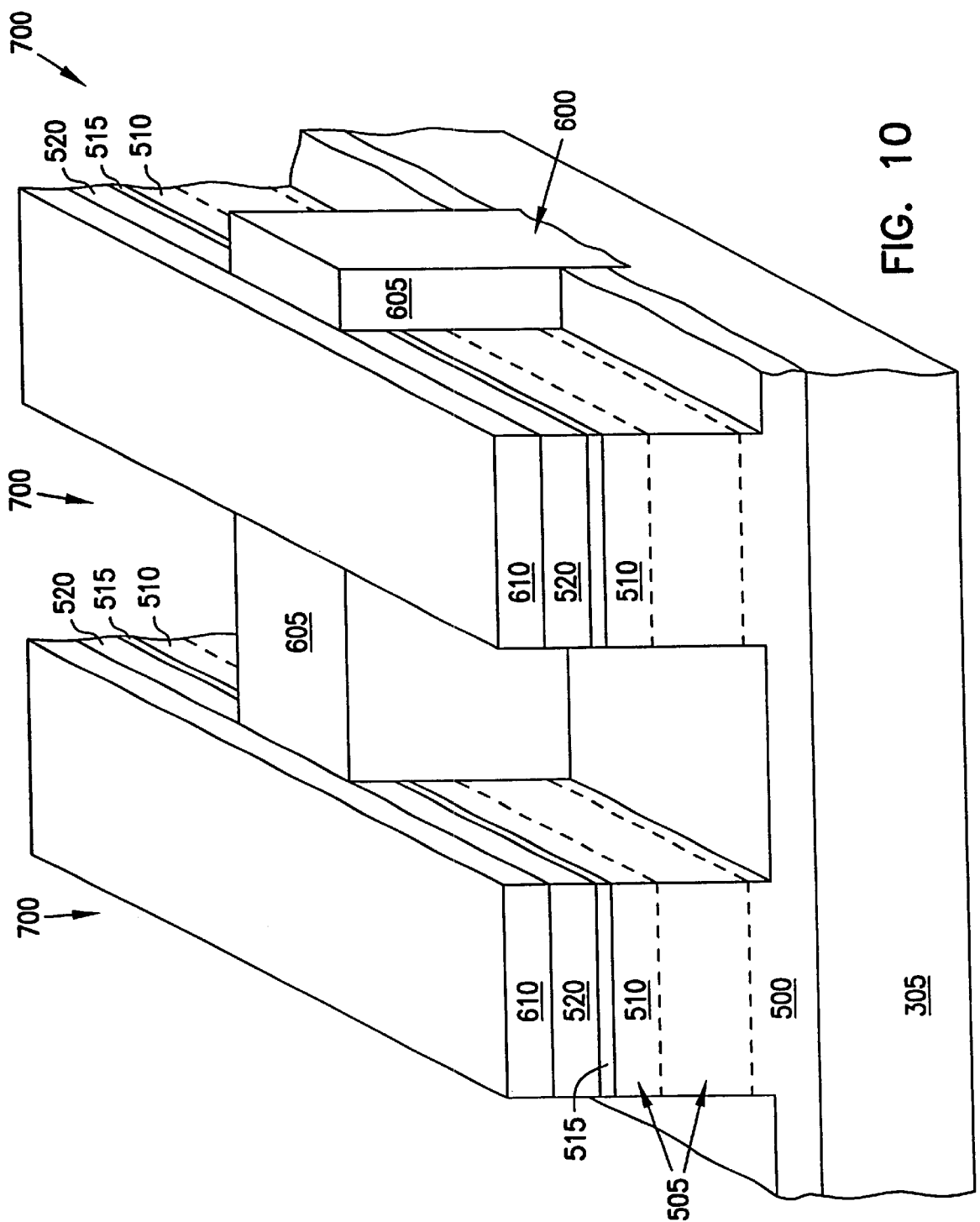
FIG. 10 is a perspective view of a plurality of parallel second troughs orthogonal to the first troughs illustrated in FIG. 9.

FIG. 10 is a perspective view, illustrating the selective etching, in a second dimension (X-dimension) that is substantially orthogonal to the first dimension (Y-dimension), of a plurality of substantially parallel second troughs 700, as described below. Forming second troughs 700 includes patterning photoresist layer 615, selectively etching masking layer 610, pad nitride 520, and underlying pad oxide 515, such that portions of silicon dioxide insulator 605 in the second troughs 700 are exposed, together with N+ silicon second source/drain layer 510. A selective etch, which preferentially removes silicon but doesn't substantially remove silicon dioxide, is used to etch through the exposed portions of second source/drain layer 510, the underlying portions of epitaxial layer 505, and approximately 100 nanometers into the underlying portions of first source/drain layer 500. Photoresist 615 is then removed by conventional photoresist stripping techniques, leaving the structure illustrated in FIG. 10.

Figure 11:
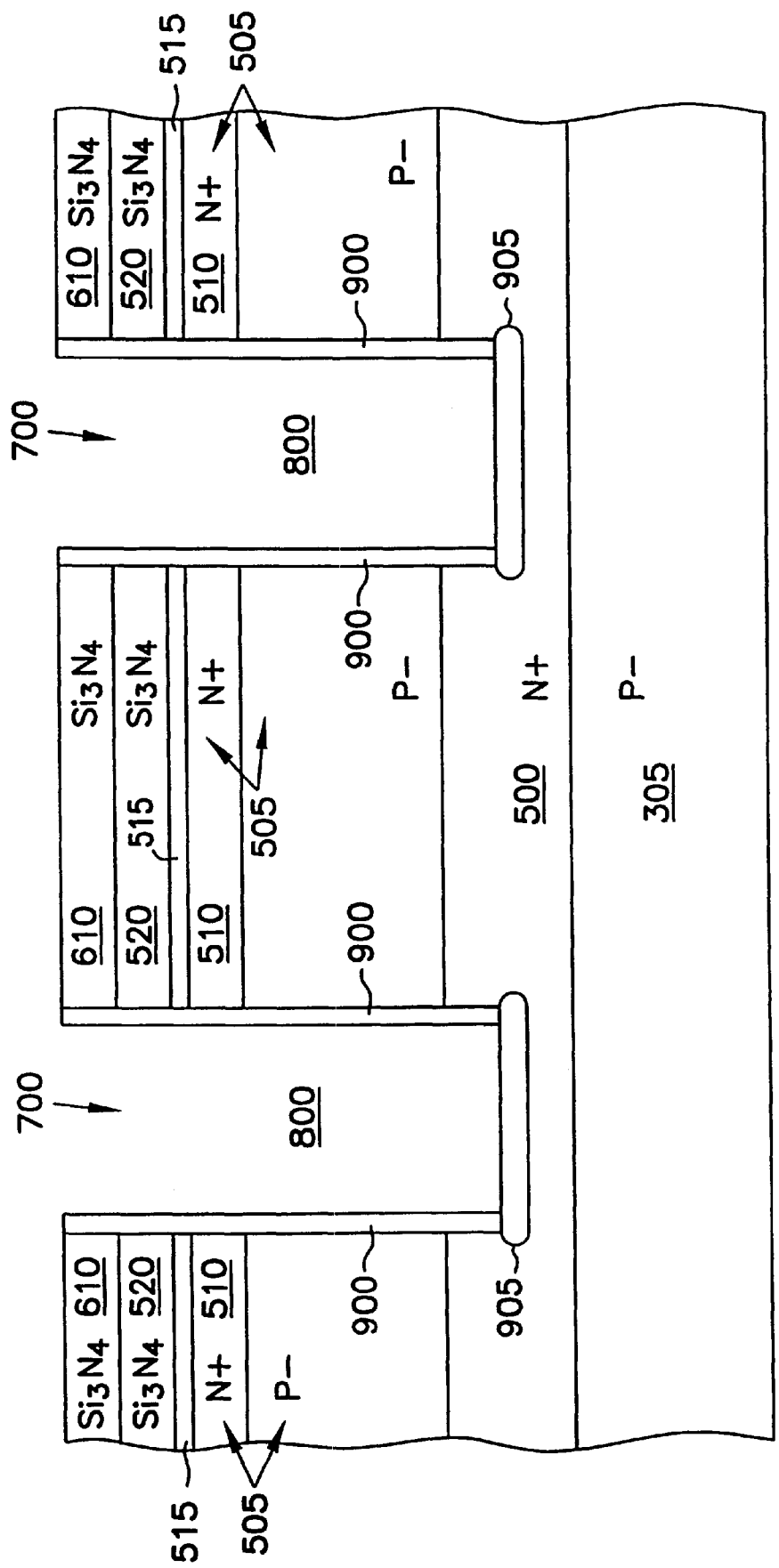
FIG. 11 is a cross-sectional view looking in the direction of the second troughs illustrated in FIG. 10.

FIG. 11 is a cross-sectional view looking in the direction of second troughs 700 (e.g. such that the X-dimension is orthogonal to the plane of the illustration of FIG. 11). In FIG. 11, a thin oxidation barrier layer 900, such as silicon nitride of approximate thickness of 20 nanometers, is conformally deposited by CVD to protect against the oxidation of sidewalls of second troughs 700. Barrier layer 900 is anisotropically etched to expose bottom portions of second troughs 700. A bottom insulation layer 905 is formed on the bottoms of second troughs 700, such as silicon dioxide of approximate thickness of 100 nanometers formed by thermal oxidation of the exposed bottom portions of second troughs 700.

Figure 12:
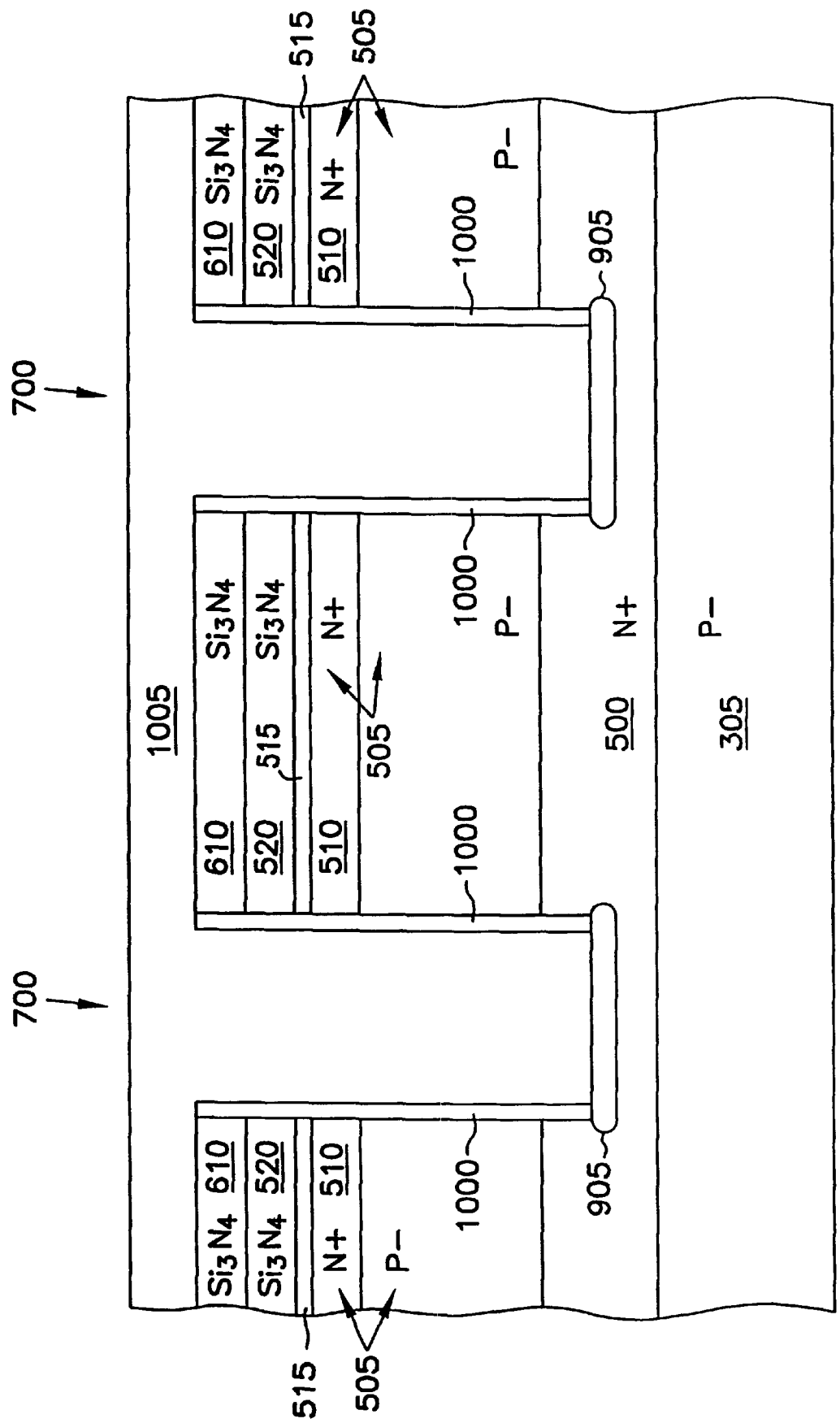
FIG. 12 is a cross-sectional view looking in the direction of the second troughs provided in FIG. 11 illustrating a barrier layer stripped from the sidewalls of the second troughs.

In FIG. 12, barrier layer 900 is stripped from the sidewalls of the second troughs 700, such as by a brief phosphoric acid etch, which is timed to expose the sidewalls of the second troughs 700 but which avoids significant removal of the thick silicon nitride masking layer 610. A gate dielectric layer 1000, such as silicon dioxide of thickness approximately between 5 nanometers and 10 nanometers (sometimes referred to as "tunnel oxide"), is formed substantially adjacent to the exposed sidewalls of the second troughs 700. A conductive layer 1005, such as N+ doped polysilicon, is formed in the second troughs 700, such as by CVD, to fill the second troughs 700. The conductive layer 1005 is planarized, such as by chemical mechanical polishing (CMP) or other suitable planarization technique.

Figure 13:
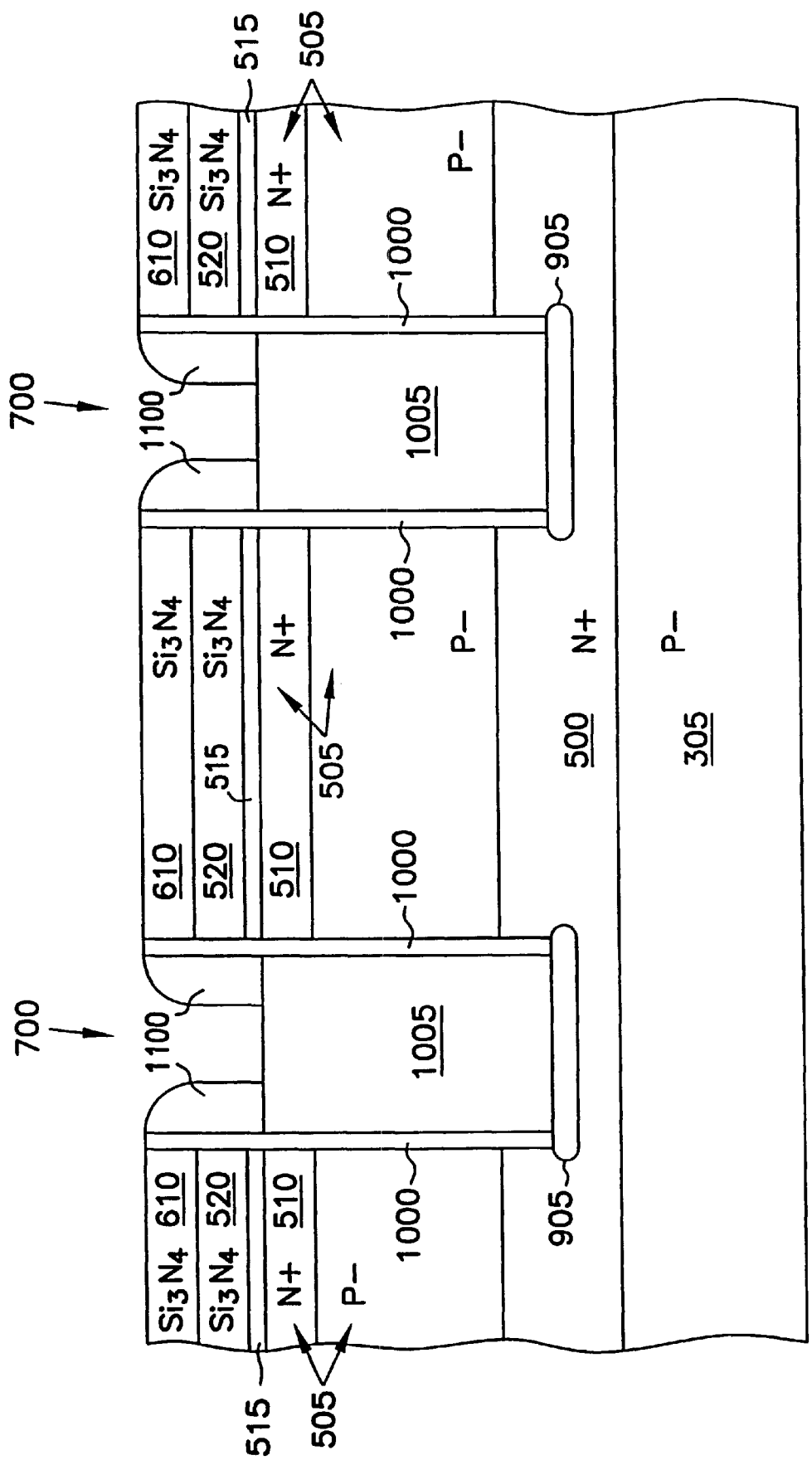
FIG. 13 is a cross-sectional view looking in the direction of the second troughs provided in FIG. 12 illustrating a conductive layer in the second troughs.

In FIG. 13, the conductive layer 1005 is etched back in the second troughs 700 to approximately at or slightly above the level of the silicon surface, which is defined by the interface between the second source/drain layer 510 and the pad oxide 515 layer. A spacer layer, such as silicon nitride of an approximate thickness of 100 nanometers, is deposited by CVD and anisotropically etched by reactive ion etching (RIE) to leave nitride spacers 1100 along the sidewalls of the second troughs 700, e.g. on the etched back portions of the conductive layer 1005, on the portions of insulator 605 in the intersections of first troughs 600 and second troughs 700, and against the second gate dielectric 1000.

Figure 14:
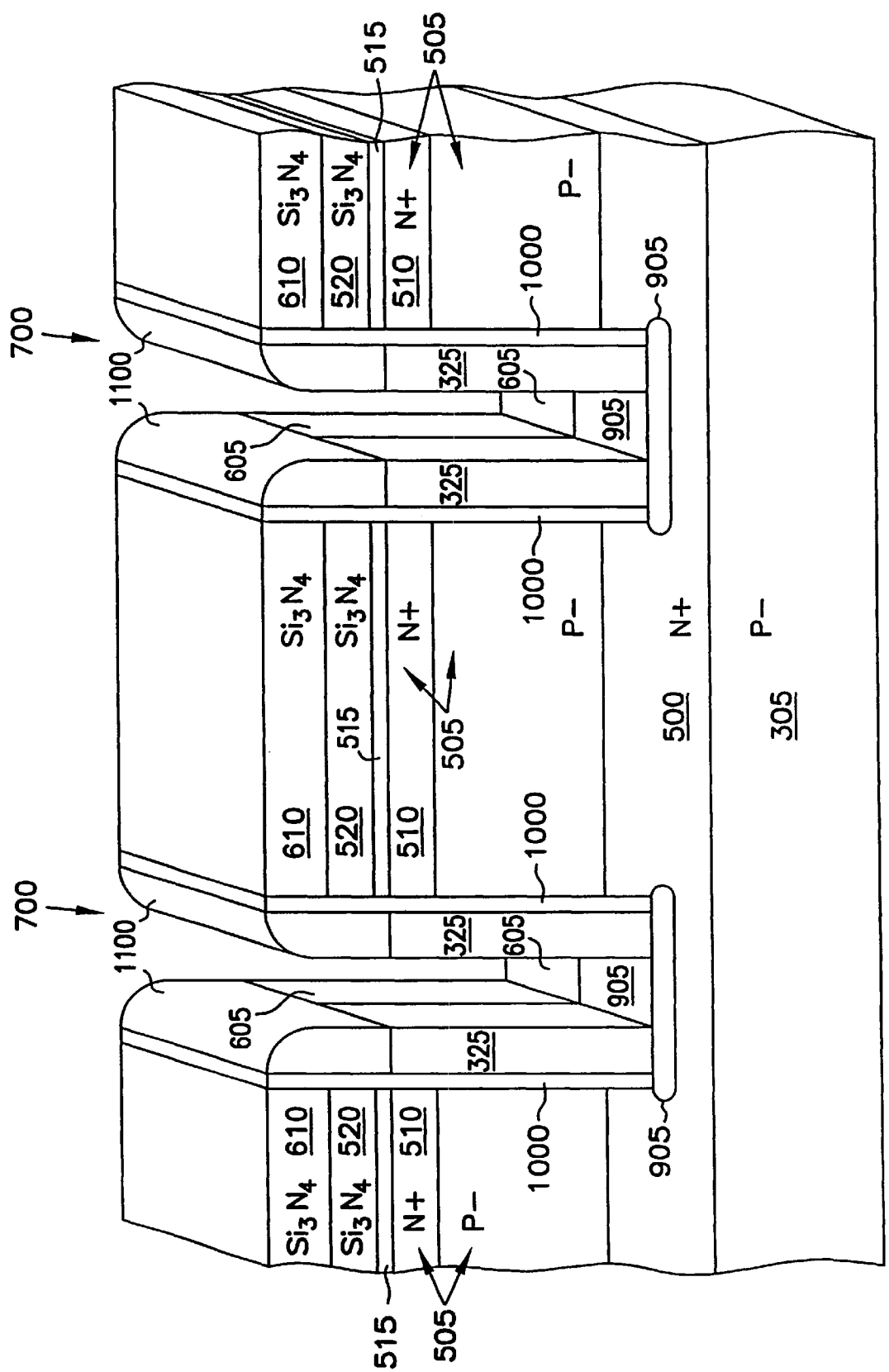
FIG. 14 is a perspective view of the second troughs provided in FIG. 13 illustrating spacers positioned for use as a mask.

In the perspective view of FIG. 14, spacers 1100 are used as a mask for the anisotropic etching in the second troughs 700 of the etched back portions of polysilicon conductive layer 1005 and the portions of silicon dioxide insulator 605. A selective etch, which preferentially removes silicon dioxide but doesn't substantially remove polysilicon, is used to etch into portions of silicon dioxide insulator 605, but not the portions of polysilicon conductive layer 1005 in second troughs 700.

The portions of silicon dioxide insulator 605 in second troughs 700 are etched until they are approximately even with adjacent portions of bottom insulating layer 905. Then, a selective etch, which preferentially removes polysilicon but doesn't substantially remove silicon dioxide, is used to etch through portions of conductive layer 1005 in second troughs until the bottom insulation layer 905 is exposed, thereby forming from the polysilicon conductive layer 1005 along the sidewalls of the second troughs 700.

Figure 15:
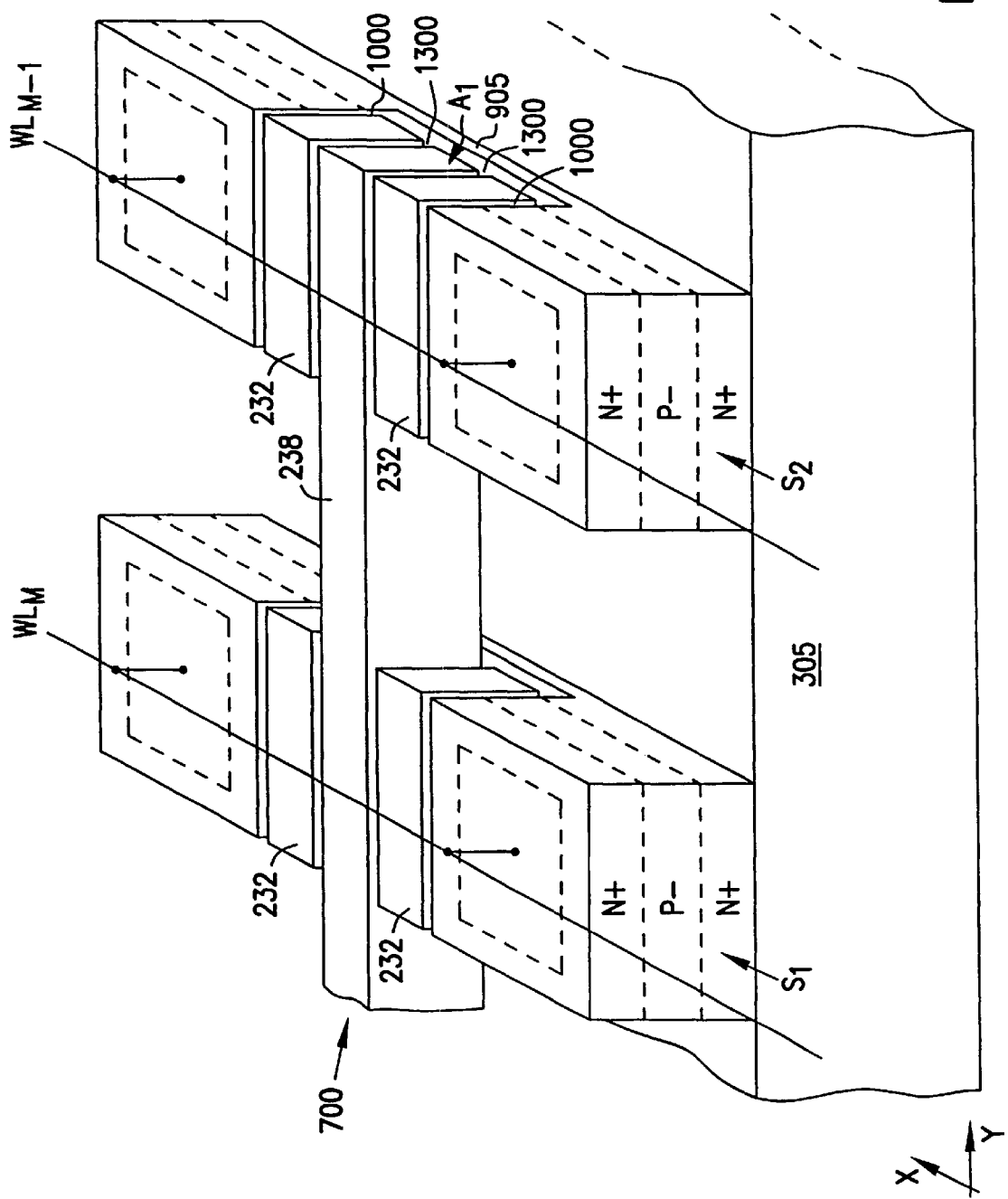
FIG. 15 is a perspective view illustrating a single control line formed between opposing floating gates in the second troughs provided in FIG. 14.

In the perspective view of FIG. 15, which is orthogonal to the perspective view of FIG. 14, an intergate dielectric 1300 is formed in the second troughs 700, such that the intergate dielectric 1300 has an approximate thickness between 7 nanometers and 15 nanometers. In one embodiment, formation of intergate dielectric 1300 is by thermal growth of silicon dioxide. In another embodiment, formation of intergate dielectric 1300 is by deposition of oxynitride by CVD.

Figure 16:
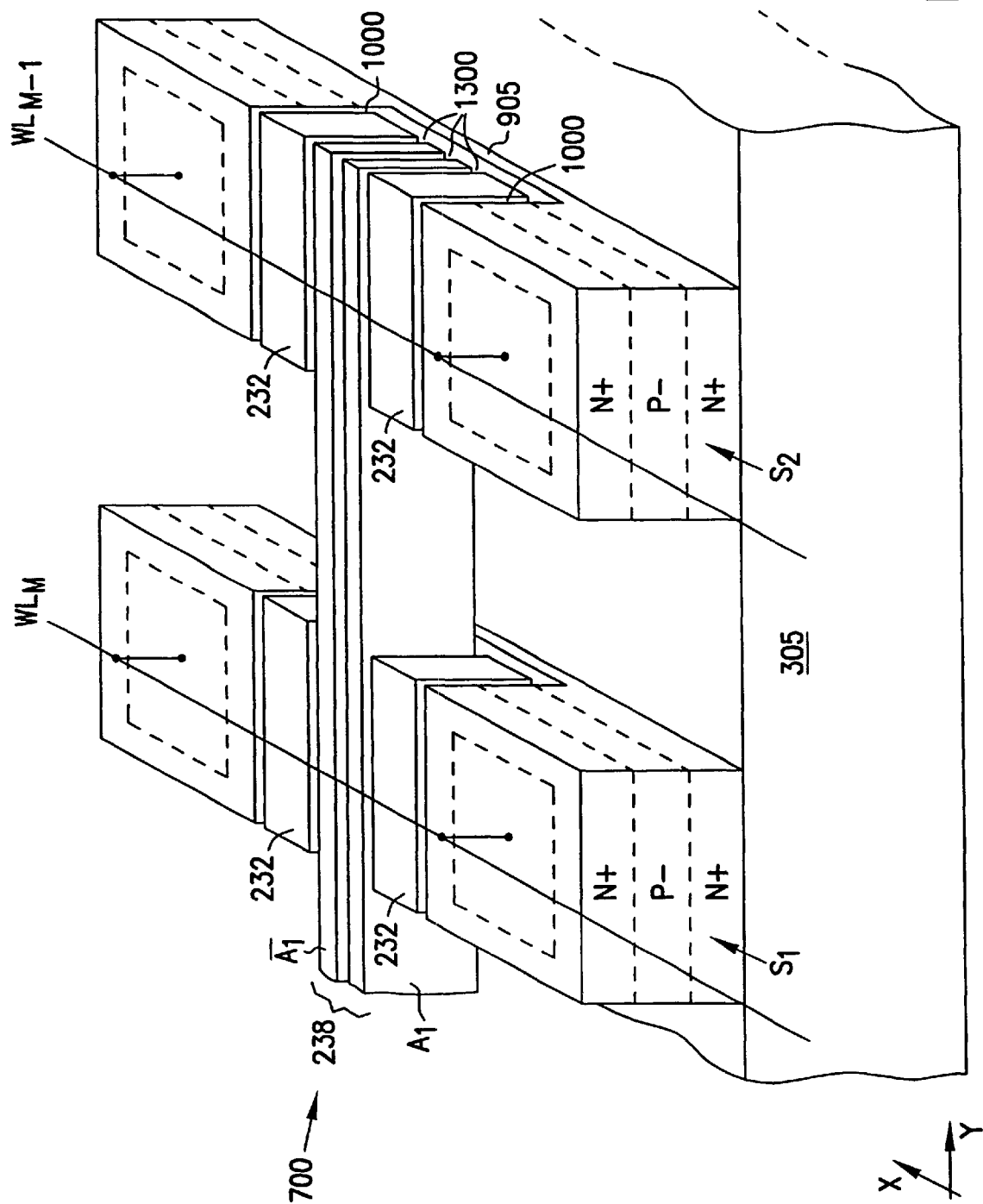
FIG. 16 is a perspective view illustrating split control lines formed between opposing floating gates in the second troughs provided in FIG. 14.

Single control lines 238, as illustrated in FIG. 15, are formed between opposing floating gates 232 in the second troughs 700 and separated therefrom by the intergate dielectric 1300. The control lines 238 in second troughs 700 are formed together with the output lines $WL_1$–$WL_m$ in second troughs 700 by a single deposition greater than 150 nanometers of N+ doped polysilicon that fills second troughs 700 and is planarized, such as by CMP down to the top level of silicon nitride masking layer 610. Split control lines 238, as illustrated in FIG. 16, are formed between opposing floating gates 232 in the second troughs 700 and separated therefrom by the intergate dielectric 1300. The control lines 238 in second troughs 700 are formed together with the output lines $WL_1$–$WL_m$ in second troughs 700 by a single deposition of approximately 70 nanometers of N+ doped polysilicon that lines second troughs 700 and is then directionally etched to leave on vertical surfaces only.

Phosphoric acid is used to remove the remaining silicon nitride, such as spacers 1100, masking layer 610, and pad nitride 520, leaving the structure illustrated in FIGS. 15 and 16. An insulator such as silicon dioxide is then deposited, and subsequent processing follows conventional techniques for forming contact holes, terminal metal, and inter level insulator steps to complete wiring of the logic cells 235 and other circuits of memory 100.

Though FIGS. 8–16 illustrate generally one embodiment of forming the memory array 105 using bulk silicon processing techniques, in another embodiment a semiconductor-on-insulator (SOI) substrate is formed from substrate 305. In one such embodiment, a P– silicon starting material is used for substrate 305, and processing begins similarly to the bulk semiconductor embodiment described in FIG. 8. However, after the first troughs 600 are formed in FIG. 9, an oxidation barrier layer is formed on the sidewalls of the first troughs 600. An isotropic chemical etch is used to fully undercut the semiconductor regions separating the first troughs 600, and a subsequent oxidation step is used to fill in the evacuated regions formed by the undercutting. As a result, an insulator is formed on the bottoms of first troughs 600, bars of SOI are formed between first troughs 600, and the topography on the working surface of substrate 305 is separated from substrate 305 by an insulating layer. The barrier layer is then removed from the sidewalls of first troughs 600, which are then filled with insulator 605, as illustrated in FIG. 9. Thus, in the above described Figures, substrate 305 is understood to include bulk semiconductor as well as SOI embodiments in which the semiconductor integrated circuits formed on the surface of substrate 305 are isolated from each other and an underlying semiconductor portion of substrate 305 by an insulating layer.

One such method of forming bars of SOI is described in the Noble U.S. patent application Ser. No. 08/745,708 which is assigned to the assignee of the present application and which is herein incorporated by reference. Another such method of forming regions of SOI is described in the Forbes U.S. patent application Ser. No. 08/706,230, which is assigned to the assignee of the present application and which is herein incorporated by reference.

Thus, the present invention provides a high density programmable memory address decoder device 214 that is easily programmed for selecting functional lines in a memory array 210. Programmability is achieved with a field-effect transistor (FET) having an electrically isolated (floating) gate that controls electrical conduction between source regions and drain regions. Programmability is accomplished without having to mask the desired logic functions into an array structure. The floating gate transistor 230 needs an area of only $2F^2$ to store a single bit of logic data.

It is to be understood that the above description is intended to be illustrative, and not restrictive. Many other embodiments will be apparent to those of skill in the art upon reviewing the above description. For example, though the logic cells 235 have been described with respect to a particular embodiment having two floating gate transistors 230 per pillar 300, a different number of floating gate transistors per pillar could also be used. It is also understood that the above structures and methods, which have been described with respect to memory address decode devices having floating gate transistors 230, are also applicable to other integrated circuits using vertically oriented field-effect transistors that do not have floating gates. Thus, the scope of the invention is not limited to the particular embodiments shown and described herein.

What is claimed is:

1. A floating gate transistor that is fabricated upon a substrate, the transistor comprising:

a first conductivity type semiconductor pillar, having top and side surfaces and formed upon the substrate;

a first source and drain region, of a second conductivity type, formed from a portion of the pillar proximal to the substrate;

a second source and drain region, of the second conductivity type, formed in a portion of the pillar that is distal to the substrate and separate from the first source and drain region;

a gate dielectric formed on at least a portion of the side surface of the pillar;

a floating gate, substantially adjacent to a portion of the side surface of the pillar and separated therefrom by the gate dielectric;

a single control line, substantially adjacent to the floating gate and insulated therefrom, wherein the single control line is associated with a pair of adjacent pillars; and an intergate dielectric, interposed between the floating gates and the single control line.

2. The floating gate transistor of claim 1, wherein the substrate is a bulk semiconductor from which the pillar outwardly extends.

3. The floating gate transistor of claim 1, wherein the substrate includes an insulating layer from which the pillar outwardly extends.

4. The floating gate transistor of claim 1 wherein the floating gate is formed substantially adjacent to two opposing side surfaces of the pillar.

5. A floating gate transistor that is fabricated upon a substrate, the transistor comprising:

a first conductivity type semiconductor pillar, having top and side surfaces and formed upon the substrate;

a first source and drain region, of a second conductivity type, formed from a portion of the pillar proximal to the substrate;

a second source and drain region, of the second conductivity type, formed in a portion of the pillar that is distal to the substrate and separate from the first source and drain region;

a gate dielectric formed on at least a portion of the side surface of the pillar;

a floating gate, substantially adjacent to a portion of the side surface of the pillar and separated therefrom by the gate dielectric;

a single control line, substantially adjacent to the floating gate and insulated therefrom, wherein the single control line is associated with a pair of adjacent pillars;

an intergate dielectric, interposed between the floating gates and the single control line; and a source line located adjacent to the first source and drain region.

6. The floating gate transistor of claim 5 wherein the source line is disposed, at least partially within the substrate.

7. The floating gate transistor of claim 6 wherein the source line is comprised of a doped semiconductor of a second conductivity type formed by ion implantation.

8. The floating gate transistor of claim 6 wherein the source line is comprised of a doped semiconductor of a second conductivity type formed by diffusing dopants into the substrate.

9. The floating gate transistor of claim 5 wherein the source line is located beneath the pillar.

10. A floating gate transistor that is fabricated upon a substrate, the transistor comprising:

a first conductivity type semiconductor pillar, having top and side surfaces and formed upon the substrate;

a first source and drain region, of a second conductivity type, formed from a portion of the pillar proximal to the substrate;

a second source and drain region, of the second conductivity type, formed in a portion of the pillar that is distal to the substrate and separate from the first source and drain region;

a gate dielectric formed on at least a portion of the side surface of the pillar;

a plurality of floating gates, substantially adjacent to a portion of the side surface of the pillar and separated therefrom by the gate dielectric;

a single control line, wherein the single control line is associated with control gates on a pair of adjacent pillars;

an intergate dielectric, interposed between the floating gate and the control line; and a source line disposed, at least partially within the substrate, the source line being located adjacent to the first source and drain region.

11. The floating gate transistor of claim 10 wherein the source line is located beneath the pillar.

12. The floating gate transistor of claim 10 wherein the source line is comprised of a doped semiconductor of a second conductivity type formed by ion implantation.

13. The floating gate transistor of claim 10 wherein the source line is comprised of a doped semiconductor of a second conductivity type formed by diffusing dopants into the substrate.

14. A logic cell, comprising:

a transistor located adjacent a substrate having a first and second source and drain region each formed from a single pillar of semiconductor material;

a single control line, wherein the single control line is associated with a pair of adjacent pillars; and at least one source and drain interconnection line coupled to the transistor at the first source and drain region wherein the source and drain interconnection line is disposed, at least partially within the substrate.

15. The logic cell of claim 14 wherein the source and drain interconnection line is comprised of a doped semiconductor formed by ion implantation.

16. The logic cell of claim 14 wherein the source and drain interconnection line is comprised of a doped semiconductor formed by diffusion of an impurity to induce conductivity.

17. A floating gate transistor that is fabricated upon a substrate, the transistor comprising:
- a first conductivity type semiconductor pillar, having top and side surfaces and formed upon the substrate;
- a first source and drain region, of a second conductivity type, formed from a portion of the pillar proximal to the substrate;
- a second source and drain region, of the second conductivity type, formed in a portion of the pillar that is distal to the substrate and separate from the first source and drain region;
- a pair of floating gates, each substantially adjacent to a portion of the side surface of the pillar and separated therefrom by a gate dielectric;
- a single control line, wherein the single control line is associated with a pair of adjacent pillars; and
- an intergate dielectric, interposed between the floating gates and the single control line.

18. The floating gate transistor of claim 17, wherein the substrate includes a silicon-on-insulator (SOI) configuration.

19. The floating gate transistor of claim 17, wherein a pitch between control lines on opposite sides of the pillar is approximately twice a minimum lithographic feature size.

20. A floating gate transistor that is fabricated upon a substrate, the transistor comprising:
- a first conductivity type semiconductor pillar, having top and side surfaces and formed upon the substrate;
- a first source and drain region, of a second conductivity type, formed from a portion of the pillar proximal to the substrate;
- a second source and drain region, of the second conductivity type, formed in a portion of the pillar that is distal to the substrate and separate from the first source and drain region;
- a pair of floating gates, each substantially adjacent to a portion of the side surface of the pillar and separated therefrom by a gate dielectric;
- a single control line, wherein the single control line is associated with a pair of adjacent pillars;
- an intergate dielectric, interposed between the floating gates and the single control line; and
- a source line located adjacent to the first source and drain region.

21. The floating gate transistor of claim 20, wherein the substrate includes a silicon-on-insulator (SOI) configuration.

22. The floating gate transistor of claim 20 wherein the source line is disposed, at least partially within the substrate.

23. A floating gate transistor that is fabricated upon a substrate, the transistor comprising:
- a first conductivity type semiconductor pillar, having top and side surfaces and formed upon the substrate;
- a first source and drain region, of a second conductivity type, formed from a portion of the pillar proximal to the substrate;
- a second source and drain region, of the second conductivity type, formed in a portion of the pillar that is distal to the substrate and separate from the first source and drain region;
- a pair of floating gates, each substantially adjacent to a portion of the side surface of the pillar and separated therefrom by a gate dielectric;
- a single control line, wherein the single control line is associated with a pair of adjacent pillars;
- an intergate dielectric, interposed between the floating gates and the single control line; and
- a source line disposed, at least partially within the substrate, the source line being located adjacent to the first source and drain region.

24. The floating gate transistor of claim 23, wherein the substrate includes a silicon-on-insulator (SOI) configuration.

25. The floating gate transistor of claim 23 wherein the source line is located beneath the pillar.

* * * * *